United States Patent
Kong et al.

(10) Patent No.: US 9,893,444 B2
(45) Date of Patent: Feb. 13, 2018

(54) BOARD-EDGE INTERCONNECTION MODULE WITH INTEGRATED CAPACITIVE COUPLING FOR ENABLING ULTRA-MOBILE COMPUTING DEVICES

(71) Applicant: INTEL CORPORATION, Santa Clara, CA (US)

(72) Inventors: Jackson Chung Peng Kong, Tanjung Tokong (MY); Eng Huat Goh, Ayer Itam (MY); Bok Eng Cheah, Bayan Lepas (MY); Su Sin Florence Phun, Bayan Lepas (MY); Khang Choong Yong, Puchong (MY); Min Keen Tang, Taman Sri Nibong (MY)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 14/863,974

(22) Filed: Sep. 24, 2015

(65) Prior Publication Data

US 2017/0093064 A1   Mar. 30, 2017

(30) Foreign Application Priority Data

Dec. 15, 2014   (MY) .............................. PI2014703803

(51) Int. Cl.
| | | |
|---|---|---|
| *H01R 12/73* | (2011.01) | |
| *H01R 12/72* | (2011.01) | |
| *C25D 7/00* | (2006.01) | |
| *C25D 5/34* | (2006.01) | |
| *C25D 5/48* | (2006.01) | |
| *H01R 13/66* | (2006.01) | |
| *H05K 3/00* | (2006.01) | |
| *H01G 4/06* | (2006.01) | |
| *H01G 4/228* | (2006.01) | |
| *H01G 4/40* | (2006.01) | |

(52) U.S. Cl.
CPC ............. *H01R 12/721* (2013.01); *C25D 5/34* (2013.01); *C25D 5/48* (2013.01); *C25D 7/00* (2013.01); *H01R 13/6625* (2013.01); *H05K 3/00* (2013.01); *H01G 4/06* (2013.01); *H01G 4/228* (2013.01); *H01G 4/40* (2013.01); *H01R 12/732* (2013.01)

(58) Field of Classification Search
CPC . H01R 12/722; H01R 13/6625; H01R 12/732
USPC ......................................... 439/620.09–620.14
See application file for complete search history.

(56) References Cited

U.S. PATENT DOCUMENTS

| | | | | |
|---|---|---|---|---|
| 4,772,225 A | * | 9/1988 | Ulery ................. | H01R 13/7195 439/620.09 |
| 4,804,332 A | * | 2/1989 | Pirc .................... | H01R 13/7195 439/620.09 |
| 4,880,397 A | * | 11/1989 | Dawson, Jr. ........ | H01R 13/7195 439/620.09 |
| 5,360,353 A | * | 11/1994 | Kinoshita ............ | H01R 13/719 439/620.09 |

(Continued)

*Primary Examiner* — Felix O Figueroa
(74) *Attorney, Agent, or Firm* — International IP Law Group, P.L.L.C.

(57) ABSTRACT

A board-edge interconnection module features integrated capacitive coupling, which enables a board design employing the module to avoid having AC capacitors and flexible cables with bulky connectors. The recovered real estate enables further miniaturization, enabling the component to be used on a wide variety of devices, including ultra-mobile computing devices.

8 Claims, 25 Drawing Sheets

(56) References Cited

U.S. PATENT DOCUMENTS 5,865,648 A * 2/1999 Clyatt, III ............ H01R 13/665
439/289
6,994,562 B2 * 2/2006 Suzuki ............... H01R 13/6658
439/61

* cited by examiner

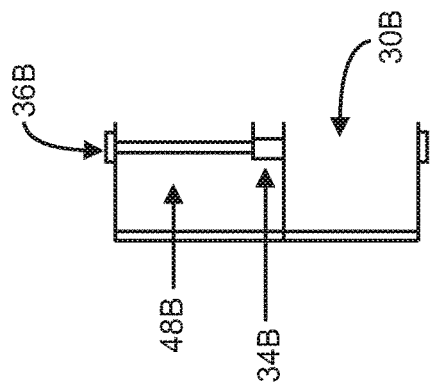
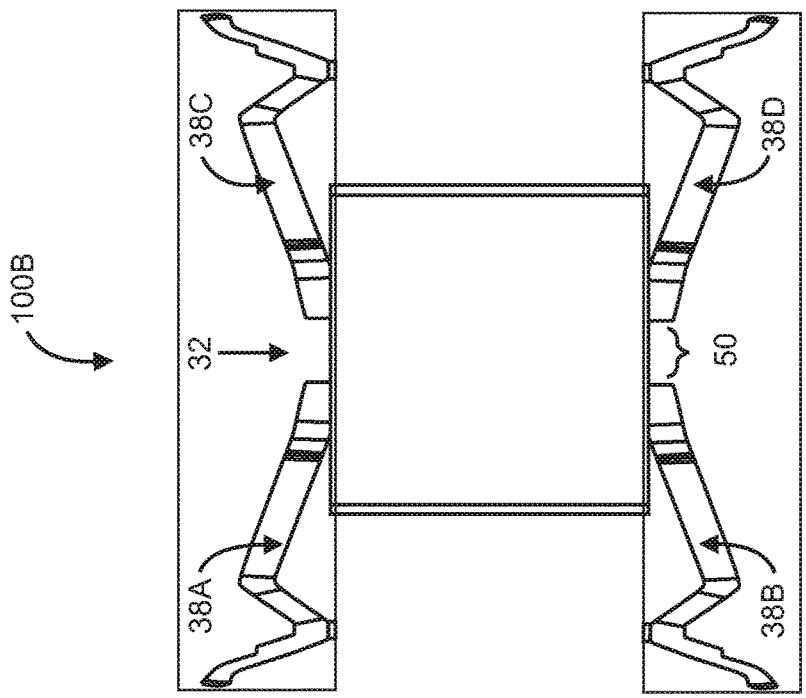
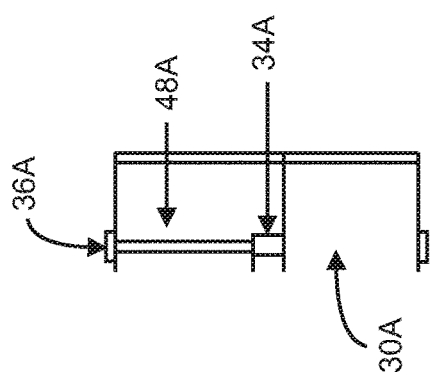

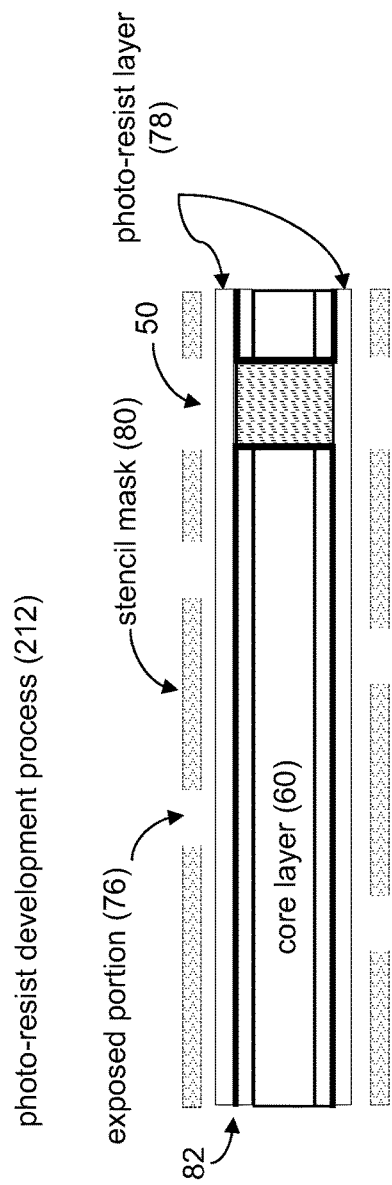
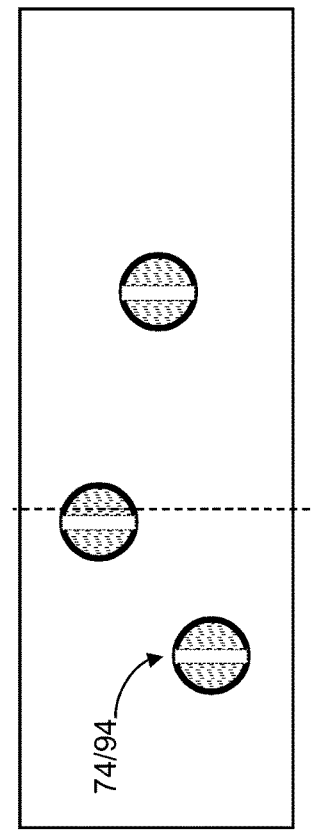
side view
Figure 19A
top view
Figure 19B

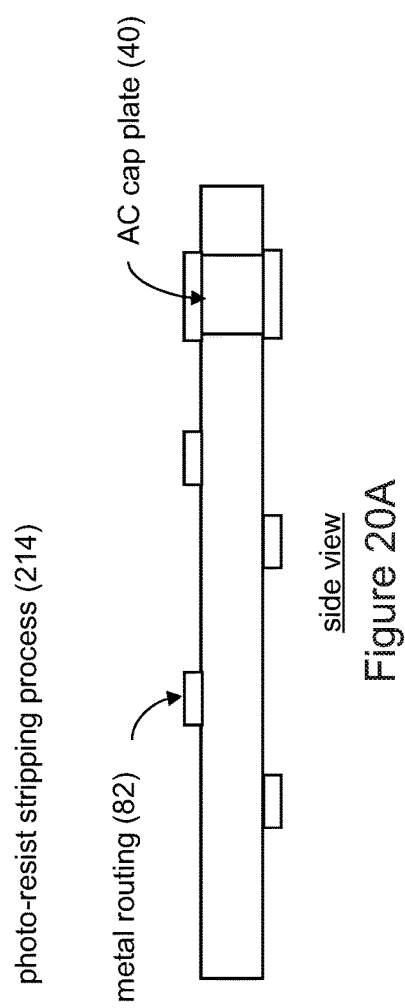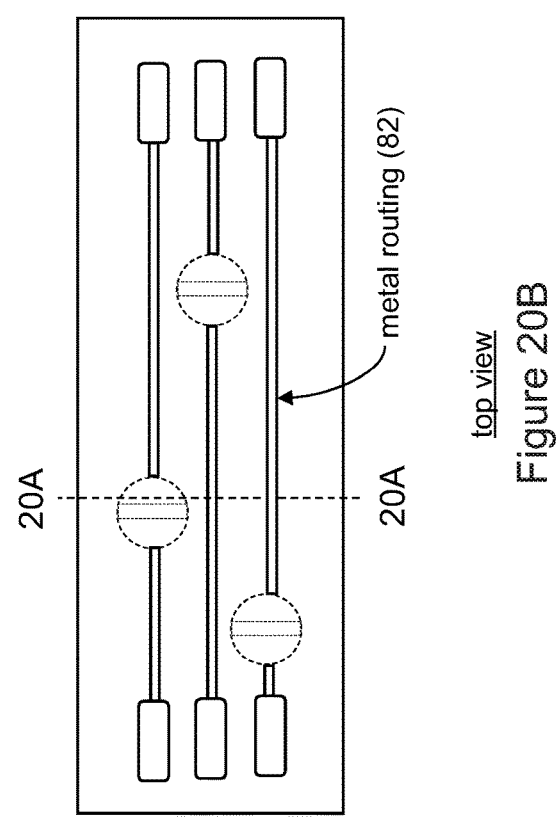
side view
Figure 20A
top view
Figure 20B

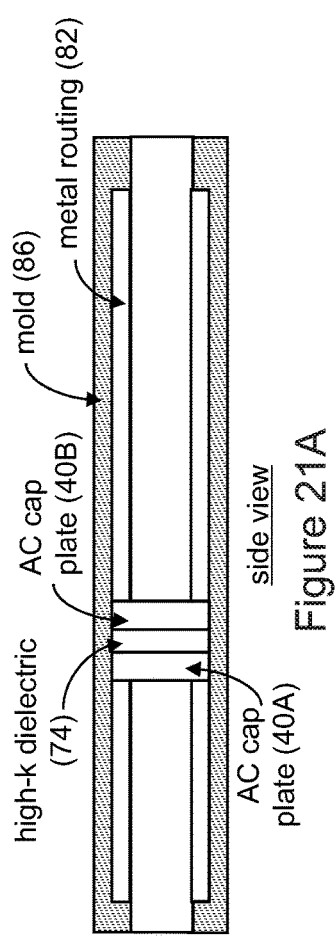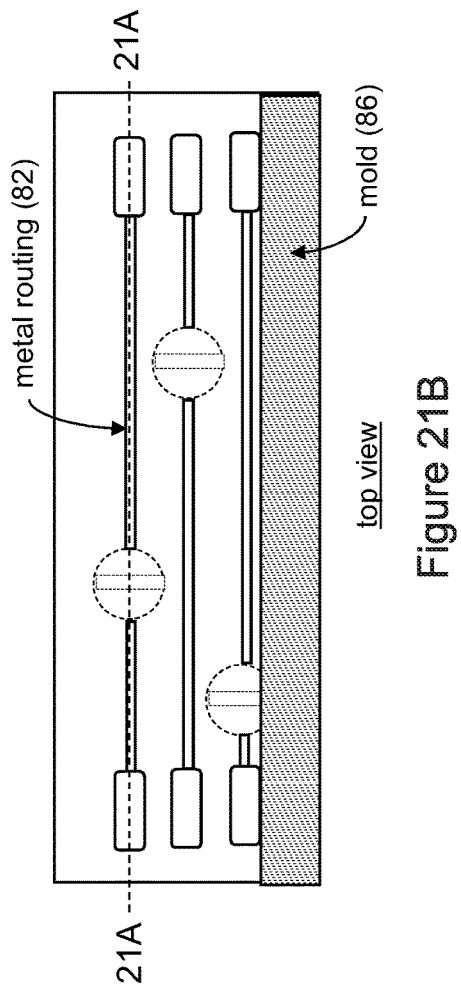
Figure 21A
Figure 21B

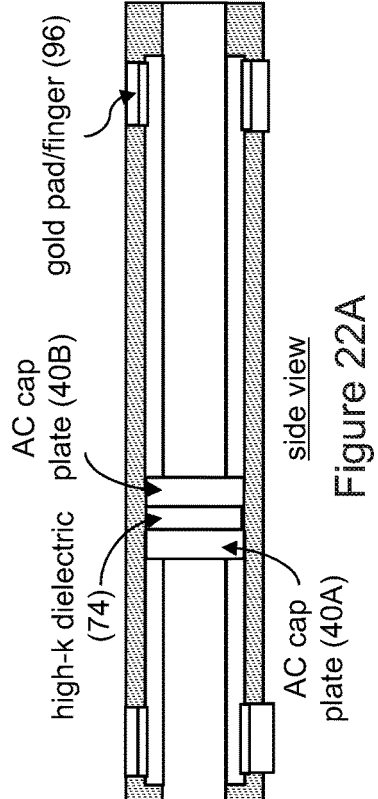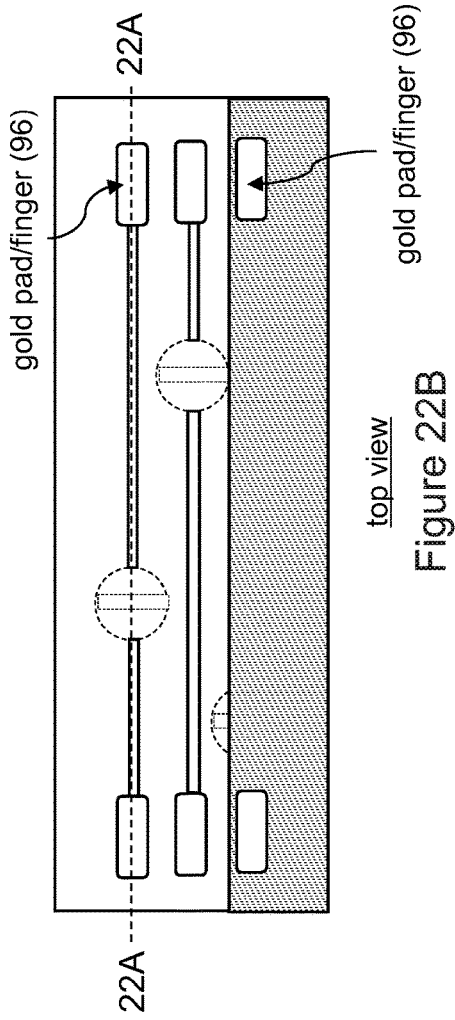
Figure 22A side view
Figure 22B top view

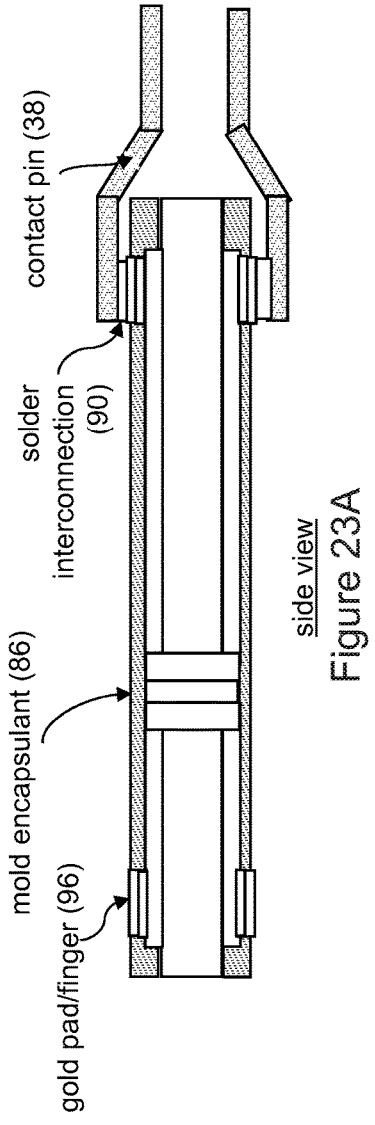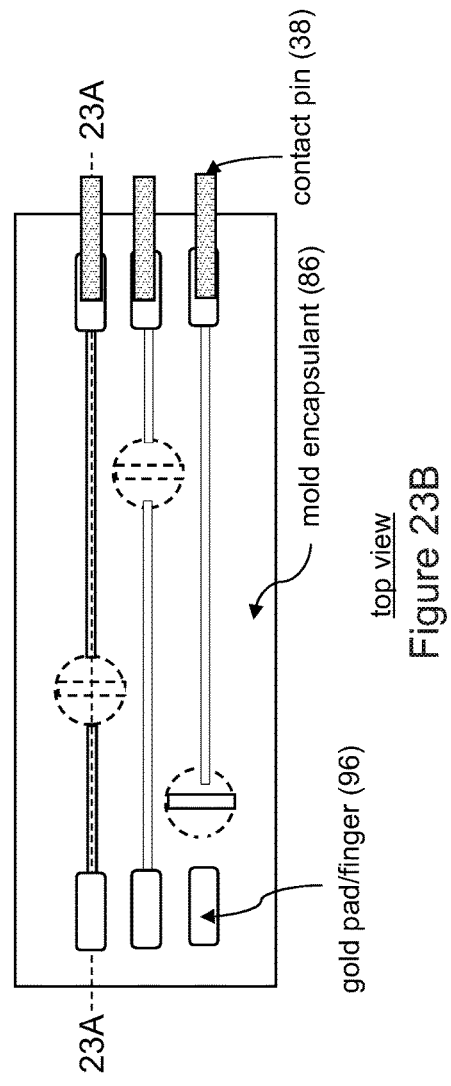

BOARD-EDGE INTERCONNECTION MODULE WITH INTEGRATED CAPACITIVE COUPLING FOR ENABLING ULTRA-MOBILE COMPUTING DEVICES

CROSS-REFERENCE TO RELATED APPLICATIONS

This application is a continuation of and claims priority to Malaysian Patent Application No. PI2014703803, filed on Dec. 15, 2014, which is incorporated herein by reference in its entirety.

TECHNICAL FIELD

This application relates to AC capacitors removal, capacitive coupling, connector design, and high-speed signaling.

BACKGROUND

Miniaturization of computing devices has enabled small form-factor devices, such as smart phones and tablets, to feature computing power that rivals desktop and laptop computers. Many of the components of these smaller devices are being designed for multiple uses, such as for smart phones and large computing devices. Wearable devices, or wearables, and Internet of Thing (IoT) devices are also becoming popular. The ability to scale a component for multiple uses is a desirable characteristic.

Because of this desired scalability, the components making up the computing device or the printed circuit board (PCB) are continuously scrutinized to recover board or component real estate and, ultimately, make the device or board smaller and smaller.

PCB real estate has seen a reduction of almost 50% from generation to generation of these conceptual systems. Fully functioning boards having measurements of 40 mm×100 mm, and even smaller, 51 mm×28 mm, are in existence today. Some boards enable both board-to-board and in-dock connections to be made.

Two components that consume some of the board real estate are connectors and alternating current (AC) capacitors. Connectors are used to couple two circuits or two boards, in which current flows between the boards through the connectors. AC capacitors isolate the direct current (DC) bias settings between two circuits, such as those used in input/output (I/O) interfaces such as the Universal Serial Bus (USB) 3.0/3.1, enhanced Peripheral Component Interconnect (PCIe) 2/3 and Serial Advanced Technology Attachment (SATA) 2/3.

Thus, there is a continuing need to have an improvement to these devices such that they consume less real estate on the board or component and therefore overcome the shortcomings of the prior art.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

FIGS. 9A-C are side views of the housing of the board-edge interconnection module of FIG. 7, according to some embodiments;

FIGS. 14-23 are visual depictions of the process steps used to manufacture the board-edge interconnection modules of FIGS. 1 and 7, according to some embodiments;

DETAILED DESCRIPTION

In accordance with the embodiments described herein, a novel board-edge interconnection module is disclosed. The board-edge interconnection module features integrated capacitive coupling, which enables a board design employing the module to reduce the number of AC capacitors thereon. The recovered real estate enables further miniaturization, enabling the component to be used on a wide variety of devices, including ultra-mobile computing devices.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. The following detailed description is, therefore, not to be construed in a limiting sense, as the scope of the subject matter is defined by the claims. In this document, the term "or" is used to refer to a nonexclusive or, such that "A or B" includes "A but not B," "B but not A," and "A and B," unless otherwise indicated.

Figure 1:
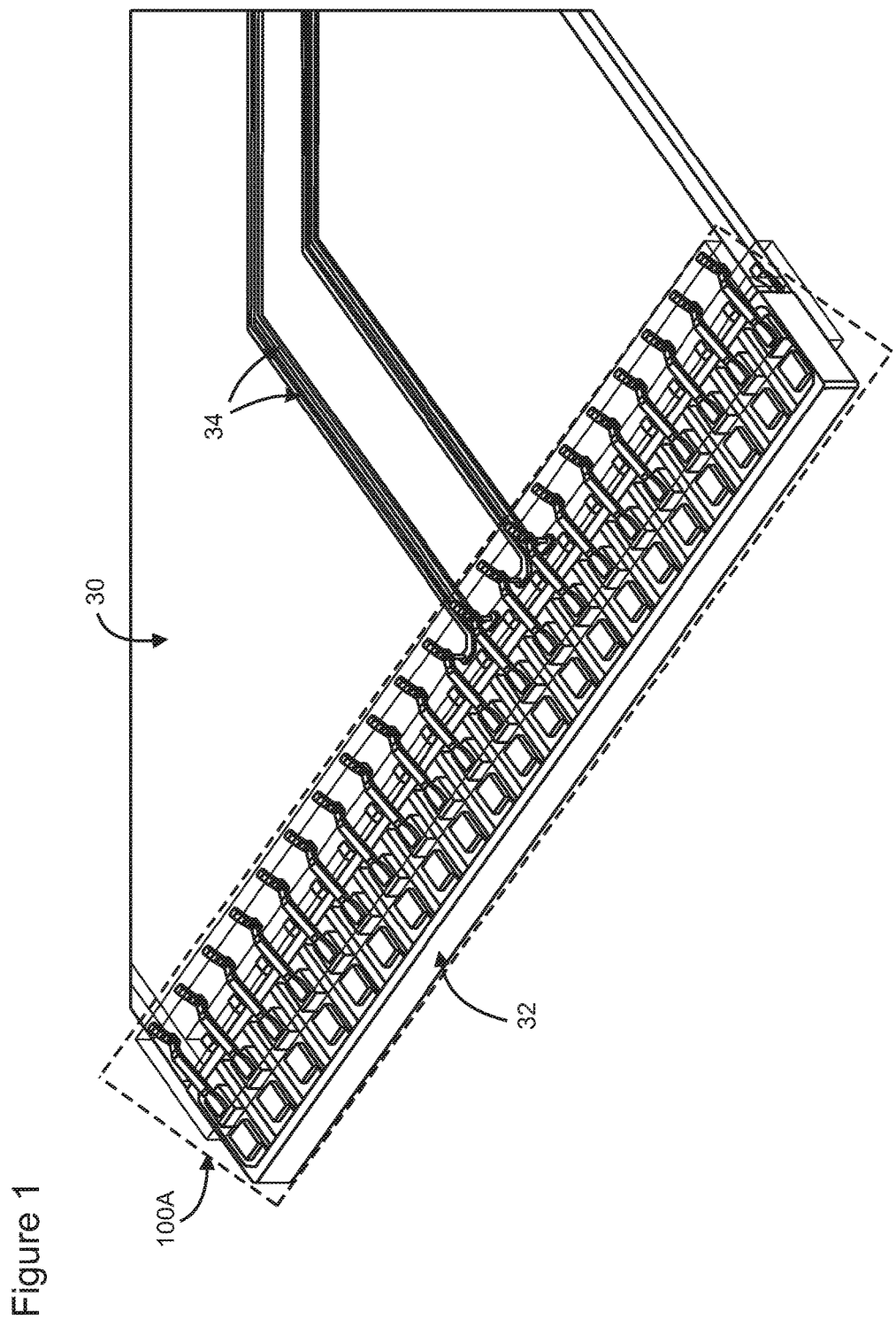
FIG. 1 is a diagram of a board-edge interconnection module for connection of a PCB to docking station, according to some embodiments.
Figure 7:
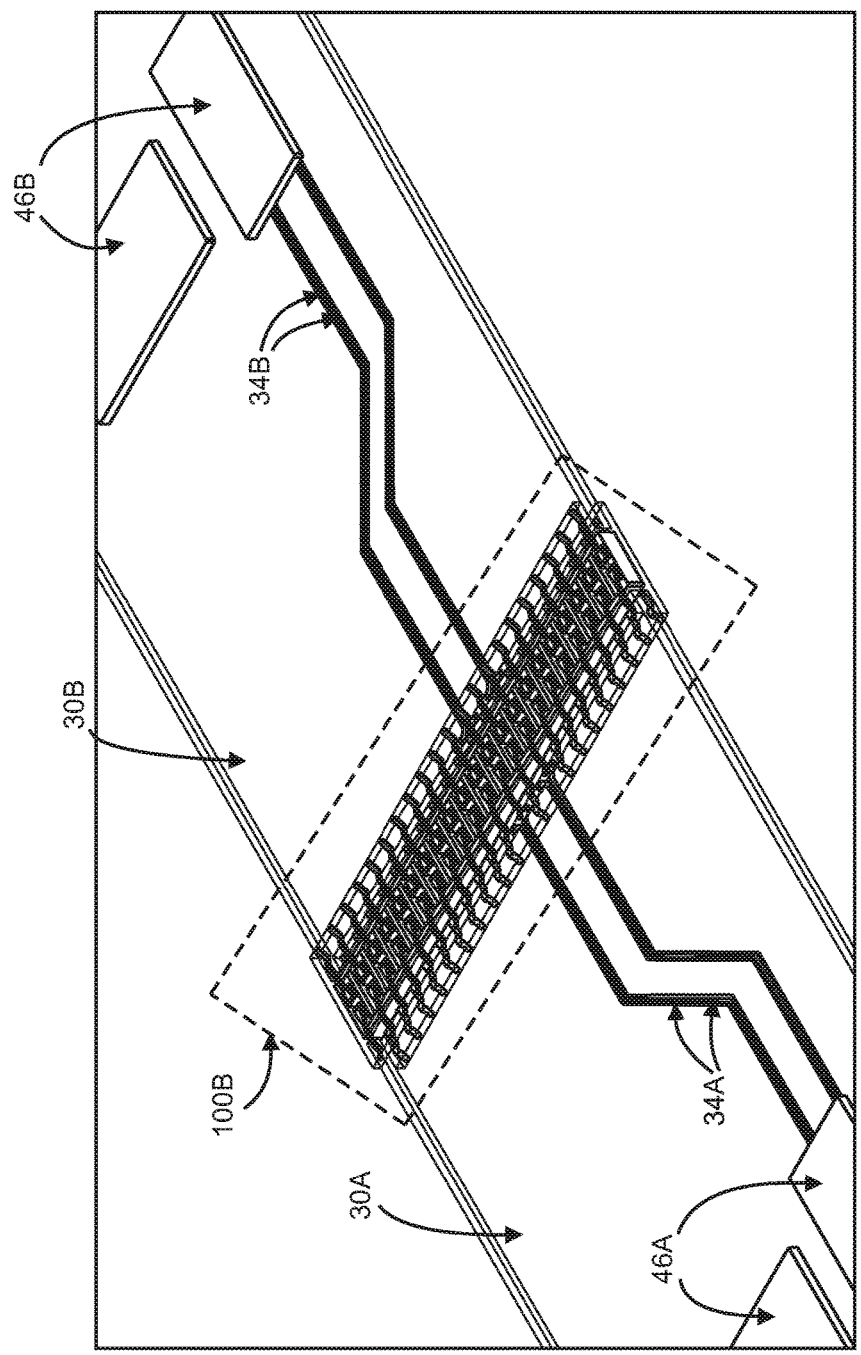
FIG. 7 is a diagram of a second board-edge interconnection module for connection between two PCBs, according to some embodiments.

FIGS. 1 and 7 are diagrams of two board-edge interconnection modules 100A and 100B (collectively, "board-edge interconnection modules 100"), according to some embodiments. The board-edge interconnection modules 100 help to enable form-factor miniaturization for advanced electronic devices with high-speed I/O interfaces such as USB 3.0+, PCIe 2/3, and SATA 2/3.

In some embodiments, the board-edge interconnection module 100A (FIG. 1) enables connection of the board to a docking station, while the interconnection module 100B (FIG. 7) is suited for board-to-board interconnections. FIGS. 1-6 feature the embodiment 100A, with FIGS. 1-4 being perspective views, FIG. 5 providing a cross-sectional view, and FIG. 6 being an overhead view.

In some embodiments, the board-edge interconnection modules 100 address the form-factor scaling of ever-increasing miniaturization of computing devices towards systems meant for wearable devices (wearables) and Internet of Thing (IoT) devices. By removing or reducing the number of on-board AC capacitors and integrating the capacitive coupling effect into the board-edge interconnection module, ultra-mobile and ultra-small form factor computing devices may be possible.

Looking more closely at FIGS. 1 and 7, the board-edge interconnection module 100 integrates on-board AC capacitors such that a component including the module may be used for both docking (FIG. 1) and board-to-board applications (FIG. 7).

In FIG. 1, printed circuit board (PCB) 30 includes, at one of its edges, a housing 32 containing the interconnection module 100A. Transmit or receive (TX/RX) traces 34 connect the interconnection module 100A to other circuitry on the PCB 30 (not shown). In some embodiments, the TX/Rx traces 34 are a differential pair of signals, one having a positive voltage, the other having a negative voltage, in which both traces are coupled to transmit a signal. A housing 32 at the edge of the board contains the relevant components, as illustrated more particularly in FIGS. 2-6, in some embodiments.

Some of these figures feature a legend revealing the size of the images, according to some embodiments. However, the principles described using these figures is not meant to be limited to circuitry of the size shown, as the board-edge interconnection modules 100 are operable under a variety of circumstances and conditions, including being part of systems having sizes smaller than or larger than are illustrated herein.

Figure 2:
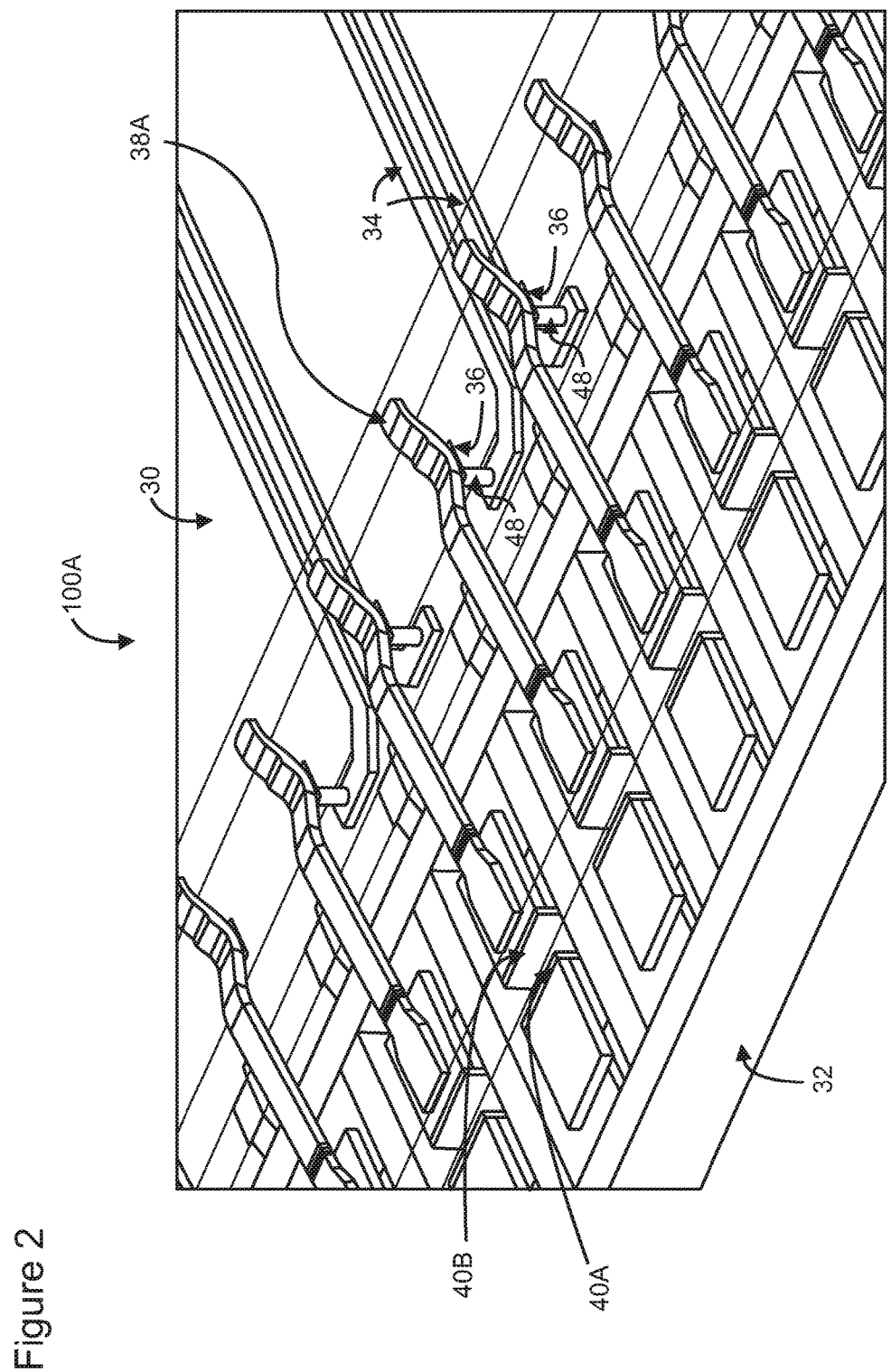
FIG. 2 is a closer view of the board-edge interconnection module of FIG. 1, according to some embodiments.

In FIG. 2, the TX/RX traces 34, which carry electrical signals to different components of the PCB 30 e.g. I/O interface such as USB3.0+, PCIe 2/3 and SATA2/3, are coupled to pad 36 (on the top surface of the PCB 30). Vertical interconnects 48, also known as micro-vias, connect the traces 34 to the pads 36. The pads 36 electrically and/or mechanically couple to the housing 32 through upper contact pins 38A and/or lower contact pins 38B (shown in FIG. 5), depending on the routing of the traces (collectively, "contact pins 38").

The contact pins 38, which may be soldered down or attached by another means, couple the housing 32 of the board-edge interconnection module 100A to the PCB 30. In some embodiments, the contact pins are of a "clip-on" variety. In some embodiments, the contact pins 38 are made from a spring steel or other material, such that, when stretched or extended from a resting configuration, they exert a force perpendicular to the direction of the stretch. This enables the contact pins 38 to securely connect the housing 32 to a docking station. The housing 32 is formed or shaped so as to be fixably inserted into a docking station (see FIG. 3). Once the housing 32 is inserted into the docking station, the PCB 30 is connected to the circuitry within the docking station.

Figure 3A:
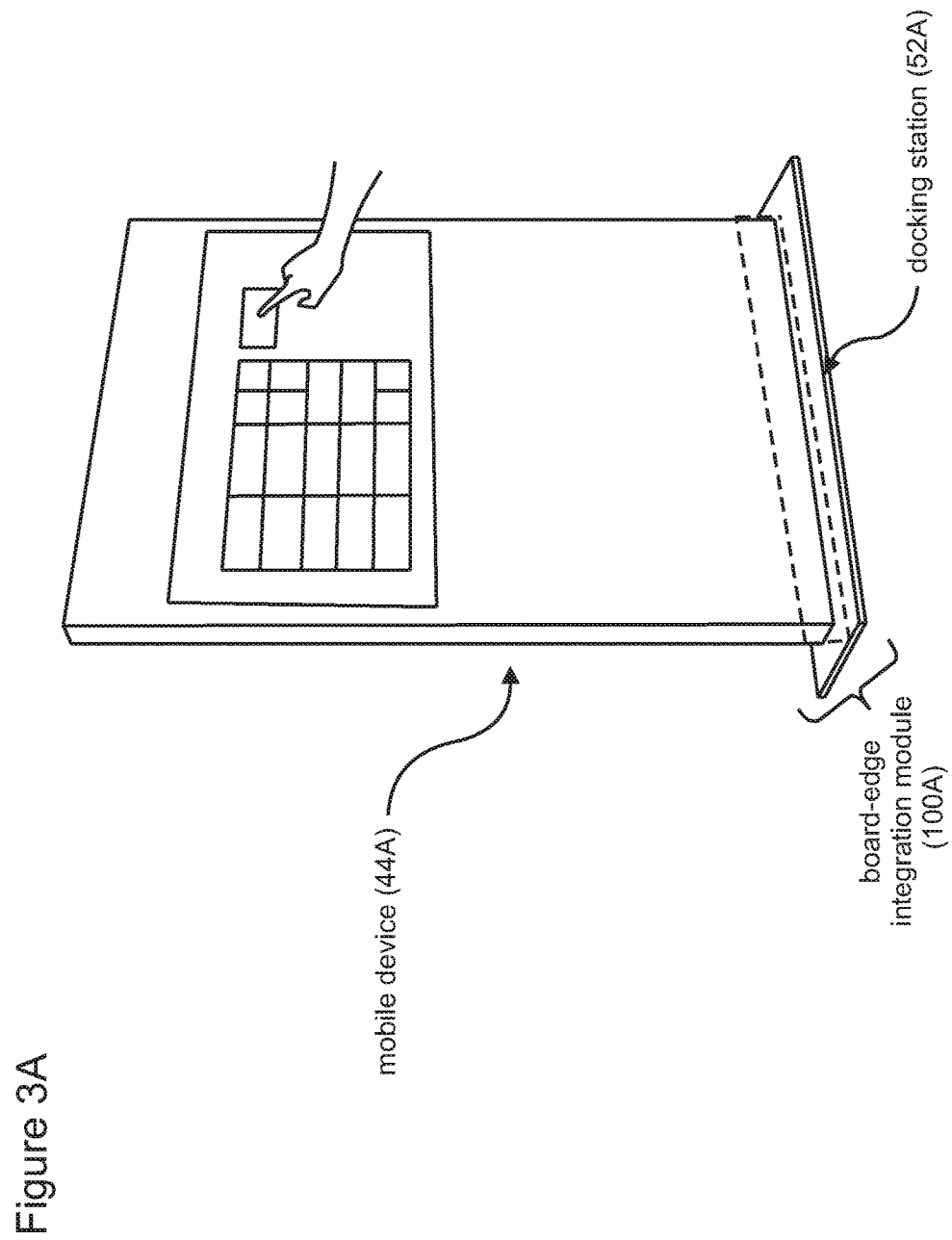
FIG. 3 is an illustration of a docking station environment in which the board-edge interconnection module of FIG. 1 would connect a mobile device to a docking station, according to some embodiments.
Figure 3B:
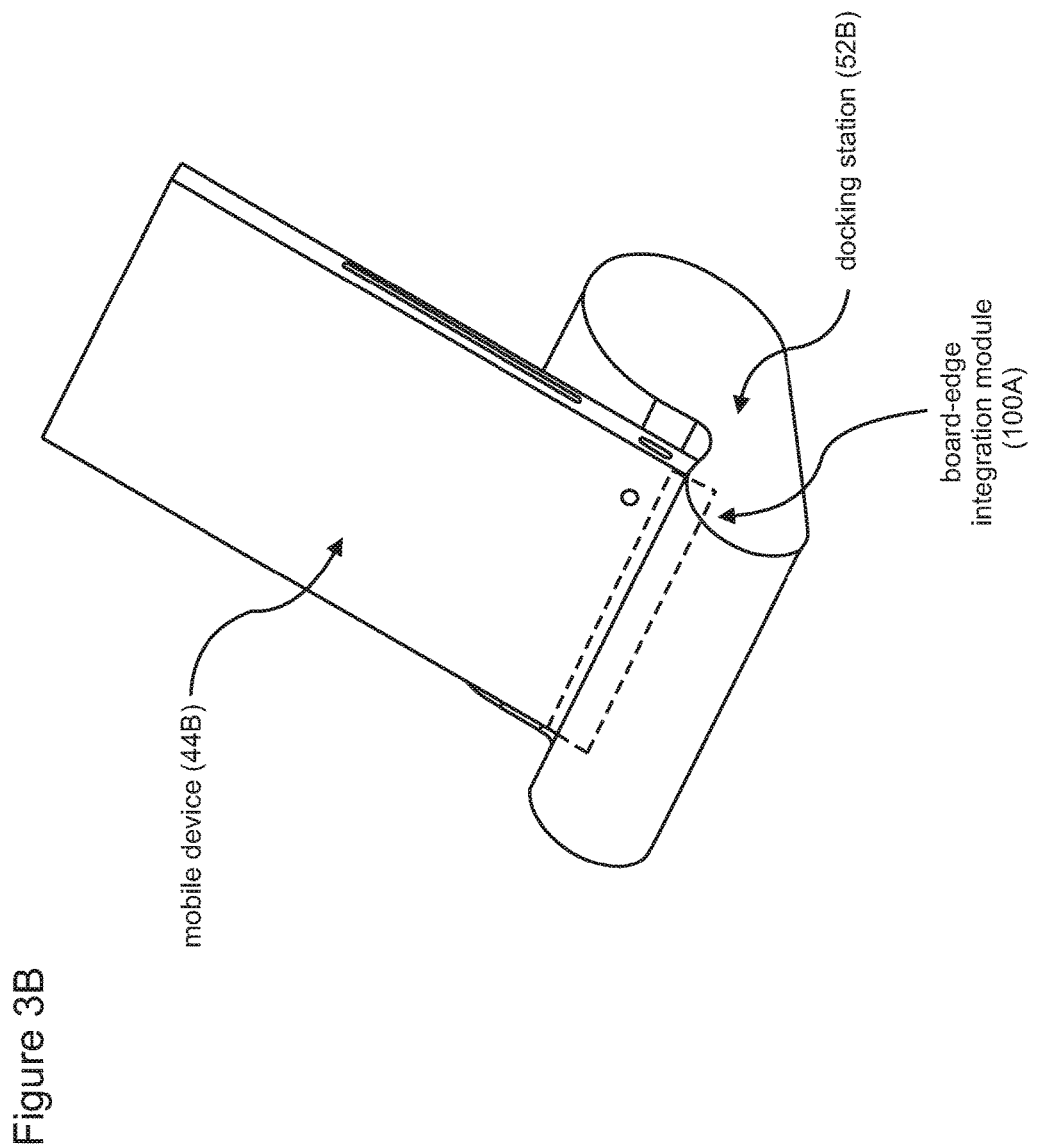

FIG. 3 is an illustrative diagram showing two mobile devices 44A and 44B (collectively, "mobile stations 44") seated into respective docking stations 52A and 52B, according to some embodiments. The board-edge integration module 100A is schematically illustrated using dashed lines. In the mobile station 44A, the board-edge integration module 100A would be disposed at its bottom edge such that the mobile device is seated orthogonally to the docking station 52A. In the mobile station 44B, the board-edge integration module 100A would also be disposed at its bottom edge such that the mobile device fits snugly into the cradle of the docking station 52B.

Figure 4:
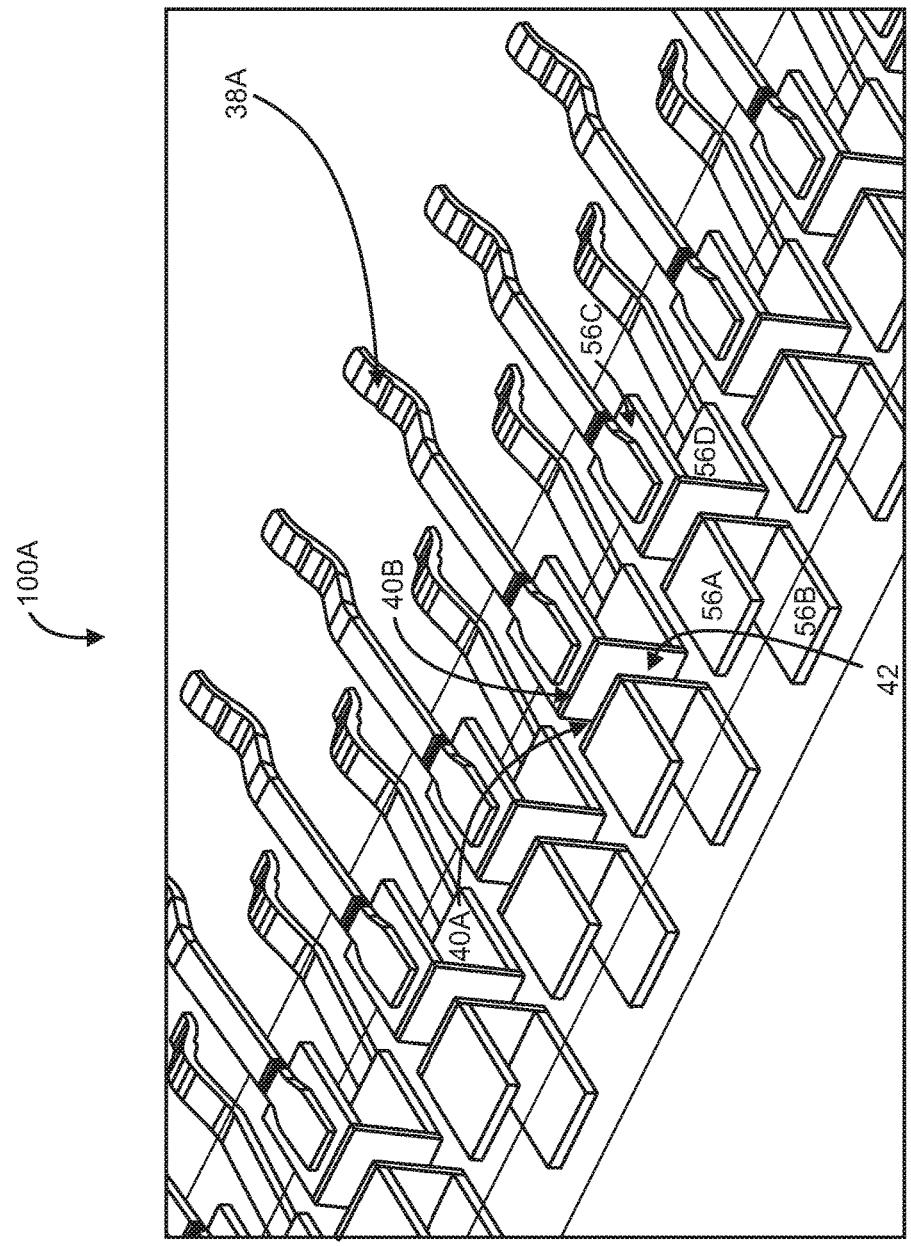
FIG. 4 is a second closer view of the board-edge interconnection module of FIG. 1, according to some embodiments.
Figure 5:
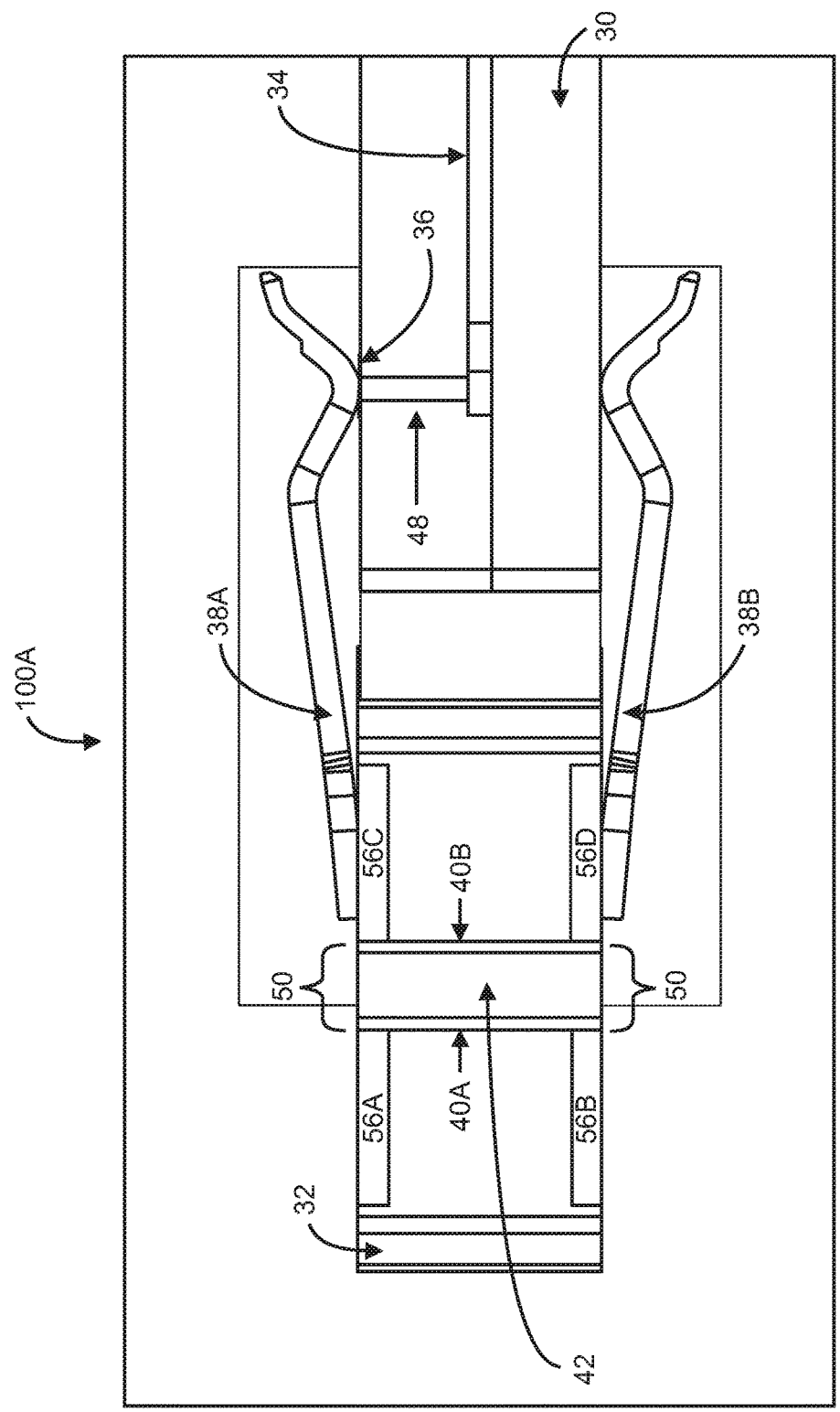
FIG. 5 is a side view of the housing of the board-edge interconnection module of FIG. 1, according to some embodiments.

With reference also to FIGS. 4 and 5, the housing 32 also features a row of two vertical plating metals 40A and 40B (collectively, "vertical plates 40" with each plate connected orthogonally to a pair of horizontal plating metals 56A-56D (collectively, "horizontal plates 56"). Thus, horizontal plate 56A connects orthogonally to a top portion of vertical plate 40A while horizontal plate 56B connects orthogonally to a bottom portion of the vertical plate 40A. Similarly, horizontal plate 56C connects orthogonally to a top portion of vertical plate 40B while horizontal plate 56D connects orthogonally to a bottom portion of the vertical plate 40B. In other embodiments (not shown), vertical plates 40 may consist of more than two vertical plating metals, where the metal plates are configured such that the positive terminal plate(s) alternate with the negative terminal plate(s). The horizontal plates 56 thus complete the electrical path between a capacitor 50 and contact pins 38. Further, in some embodiments, the horizontal plates 56 facilitate attachment of the housing 32 to the docking station 52.

Looking in particular at FIG. 5, the horizontal plates 56C and 56D form the electrical coupling between the capacitor 50 and the respective contact pins 38A and 38B. The horizontal plates 56A and 56B will also complete an electrical path between the capacitor 50 and the conductive circuitry of the docking station 52 (not shown). In FIG. 5, the horizontal plates 56A and 56B are not connected to the housing 32. Once the housing 32 of the board-edge interconnection module 100A is seated into the docking station 52 (see FIG. 3), the electrical connection between the horizontal plates 56A and 56B and the electrically conductive circuitry inside the docking station will be made.

The two vertical plates 40 and the high-k dielectric material 42 form the AC capacitors 50. Capacitors generally are passive electrical components that store energy in an electrical field by way of two electrical conductors separated by a dielectric, which is an insulator. The electrical conductors are disposed parallel to one another, and may consist of any type of metal. The dielectric may also consist of a variety of materials, such as glass, air, oxide material, and so on. The capacitance of the capacitor improves when the metal plates are close together and when they have a large surface area. The higher the $\in$ value, or permittivity, of the dielectric, the higher the charge capacity of the capacitor. Dielectric material is classified using a k value, where k is a dielectric constant. Capacitors with high-k dielectric material are particularly used in miniaturized component manufacture.

In some embodiments, the vertical plates 40 are embedded in a high-k dielectric material 42, thus forming the capacitor 50. When the PCB 30 is coupled to a docking station by way of the housing 32, the AC capacitors 50 isolate any DC bias setting between the PCB 30 and circuitry found in the docking station (not shown).

Figure 6:
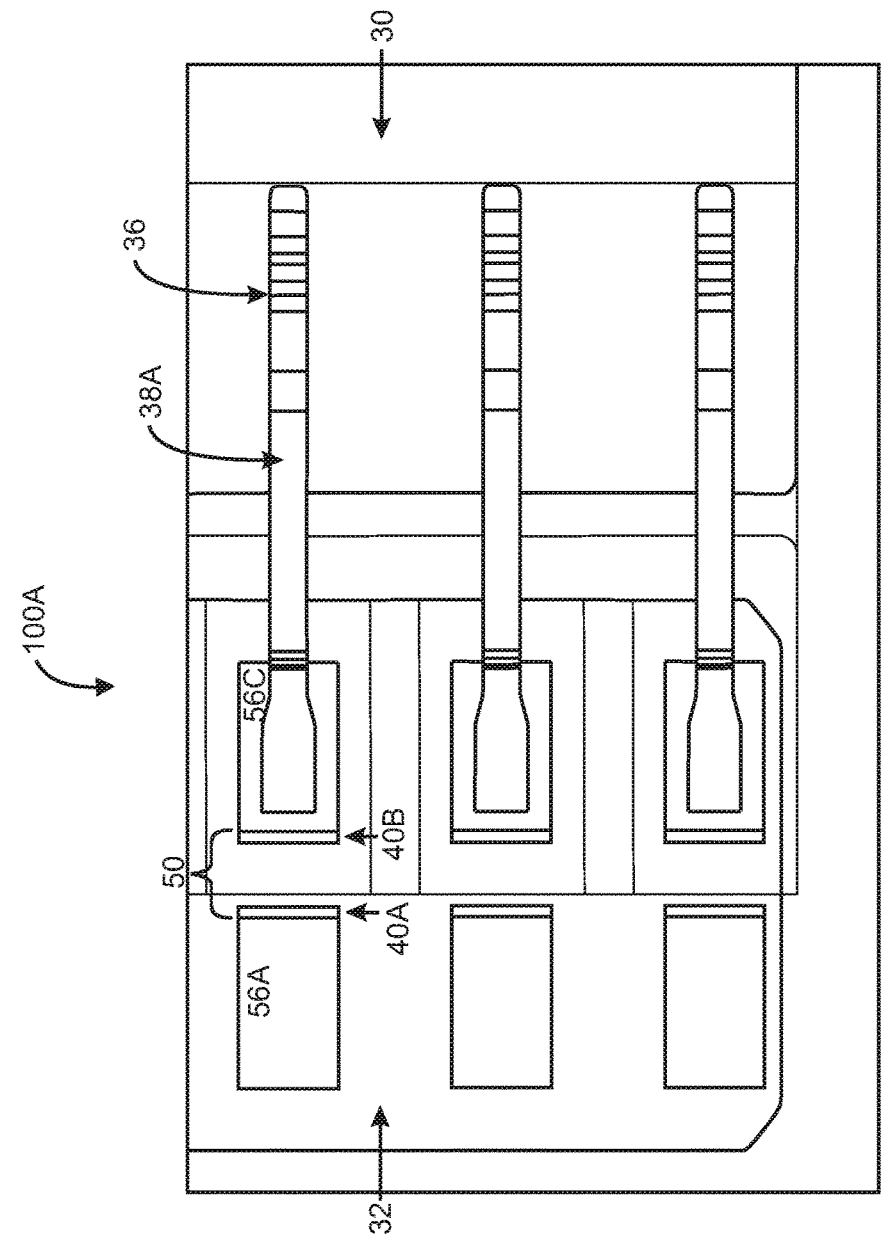
FIG. 6 is an overhead view of the housing of the board-edge interconnection module, according to some embodiments.

FIG. 6 is an overhead view of a section of the board-edge interconnection module 100, according to some embodiments. The top horizontal plates 56A and 56C are visible in FIG. 6 while the bottom horizontal plates 56B and 56D are not. The vertical plates 40A and 40B that make up the capacitor 50 are also shown in FIG. 6. The housing 32 of the board-edge interconnection module 100 is connected to the PCB 30 by way of the contact pins 38, with only the top contact pin 38 being visible in the overhead view. The horizontal plates 56 complete the electrical path between the capacitor 50 and contact pins 38. Further, in some embodiments, the horizontal plates 56 facilitate attachment of the housing 32 between the two PCBs 30.

The board-edge interconnection module 100 is an improvement over current solutions such as PC-on-a card conceptual systems. A system employing the board-edge interconnection module 100, in some embodiments, may shrink a core platform consisting of a core central processing unit (CPU) and platform controller hub (PCH) components to fit into smartphones, wearables, or IoT devices.

The board-edge interconnection module 100 is capable of replacing the conventional flex-cable with on-board connector and the on-board AC capacitors. In some embodiments, the board-edge interconnection module 100 employs high-k dielectric materials, such as class 2 ceramic capacitors or capacitors containing ferroelectric ceramic material (and having a permittivity of up to 14,000 Farads/meter).

FIGS. 7-13 are diagrams of the board-edge interconnection module 100B, according to some embodiments. In contrast to the docking station applications described above, the design 100B is suited to board-to-board interconnections. FIG. 7 shows the board-edge interconnection module 100B connecting two PCBs 30A and 30B (collectively, "PCBs 30") together, according to some embodiments. PCB 30A features two chips 46A, with one chip being connected to the module 100B by way of TX/RX traces 34A. PCB 30B also features two chips 46B (collectively, "chips 46"), with one chip being connected to the module 100B by way of TX/RX traces 34B (collectively, "TX/RX traces 34" or "traces 34").

Figure 8:
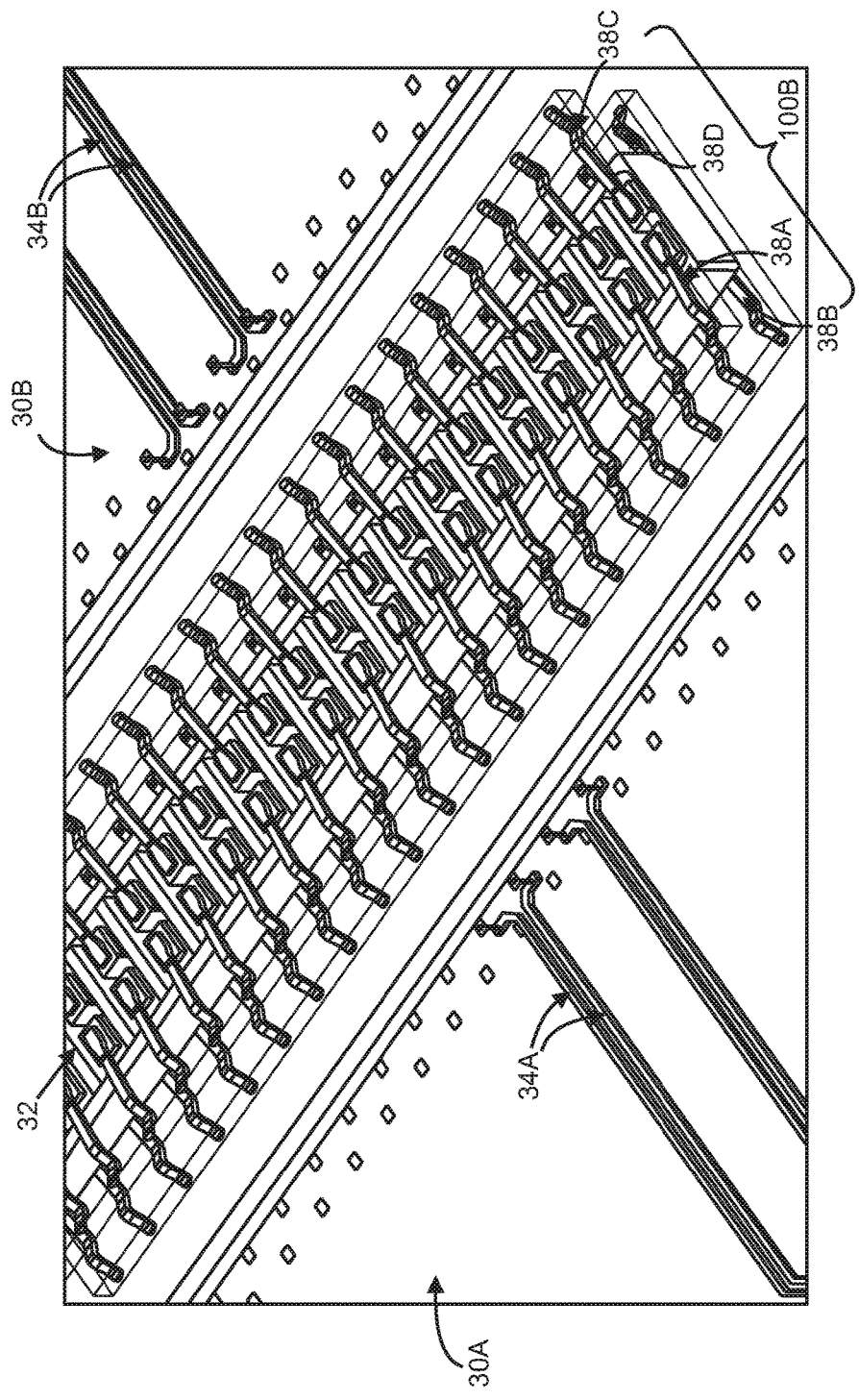
FIG. 8 Is a second view of the board-edge interconnection module of FIG. 7, according to some embodiments.

In contrast to the interconnection module 100A, the board-edge interconnection module 100B features two sets of contact pins, described with respect to the view in FIG. 8. Thus, upper left contact pin 38A and lower left contact pin 38B connect housing 32 of the module 100B to the PCB 30A; upper right contact pin 38C and lower right contact pin 38D connect the housing 32 to the PCB 30B. In some embodiments, as with the contact pins used in the interconnection module 100A, the contact pins 38 are made from a spring steel or other material, such that, when stretched or extended from a resting configuration, they exert a force perpendicular to the direction of the stretch. This enables the contact pins 38 to securely connect the housing 32 to the PCBs 30. Once the housing is connected to both PCBs 30, the TX/RX traces 34A and 34B form a connected pathway to the various circuitry of both PCBs.

FIGS. 9A-C present side views of the board-edge interconnection module 100B, according to some embodiments. The housing 32 is connected to the PCBs 30 using the two pairs of contact pins 38. Thus, PCB 30A is connected to the housing 32 using upper left contact pin 38A and lower left contact pin 38B; PCB 30B is connected to the housing 32 using upper right contact pin 38C and lower right contact pin 38D. Connection to the TX/RX traces 34 of the PCBs 30 is made by connecting the upper contact pins 38A to pad 36A and upper contact pins 38C to pad 36B (collectively, "pads 36"), with the pads being connected to the respective micro-via 48A and micro-via 48B (collectively, "micro-vias 48"). The lower contact pins 38B and 38D are spring-loaded and/or soldered down so as to secure the housing 32 securely to the respective PCB 30. In this example, the lower contact pins 38B and 38D are not coupled to an electrically conductive element (e.g., the TX/RX traces 34 and the vias 48). However, where TX/RX traces and pads are found on the bottom of the PCBs 30, as is often the case, the lower pins 38B and 38D may also connect to an electrically conductive element.

Although not shown in the images of FIGS. 9A-C, similar to the embodiment of FIG. 5, the capacitor 50 is contained within the housing 32. Vertical plates 40A and 40B form the parallel plates of the capacitor 50, with dielectric material 42 disposed therebetween. Horizontal plates 56A-56D connect the capacitor 50 to respective contact pins 38A-38D.

Figure 10:
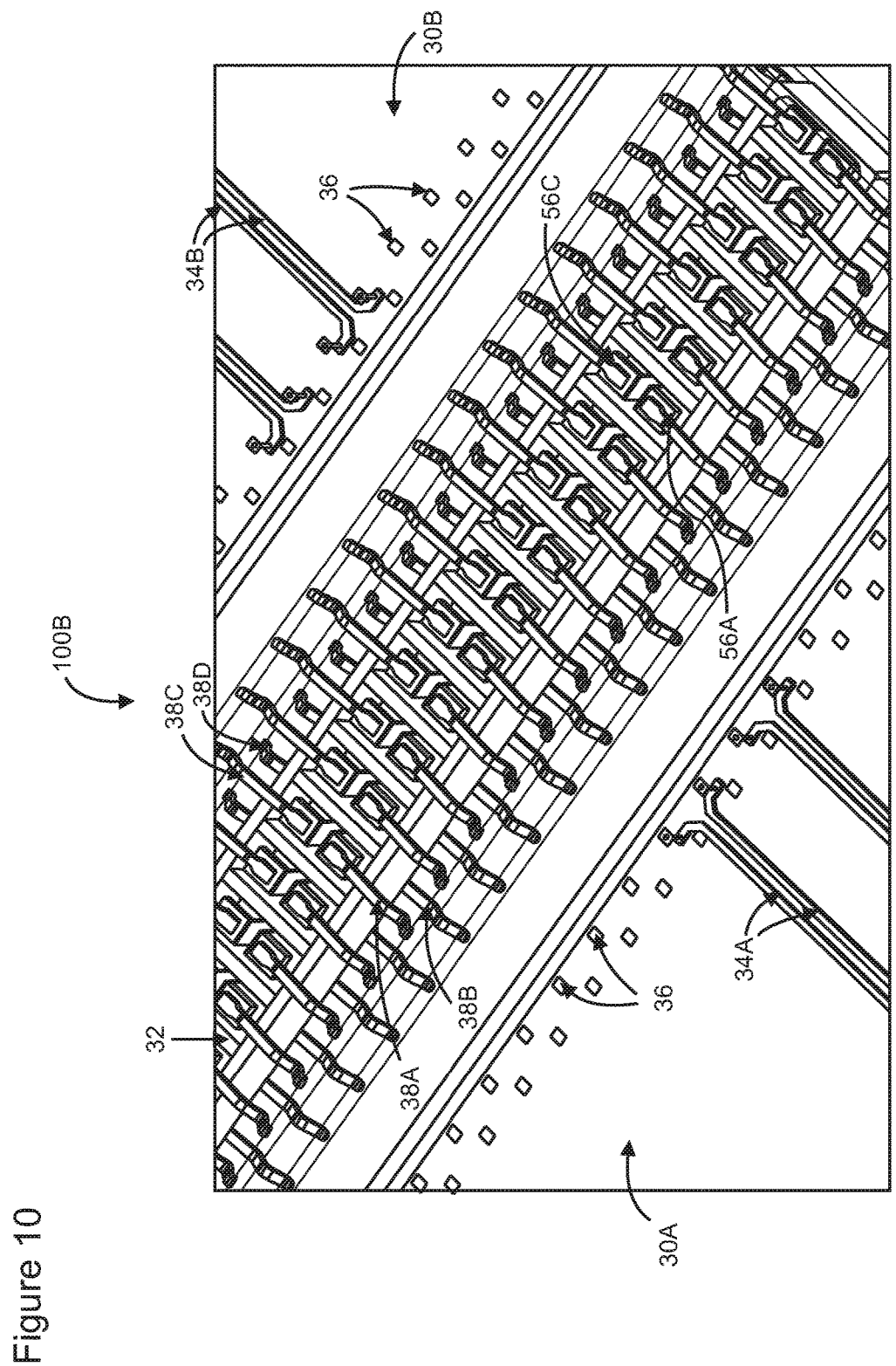
FIG. 10 is a perspective view of the board-edge interconnection module of FIG. 7, with the housing visible, according to some embodiments.
Figure 11:
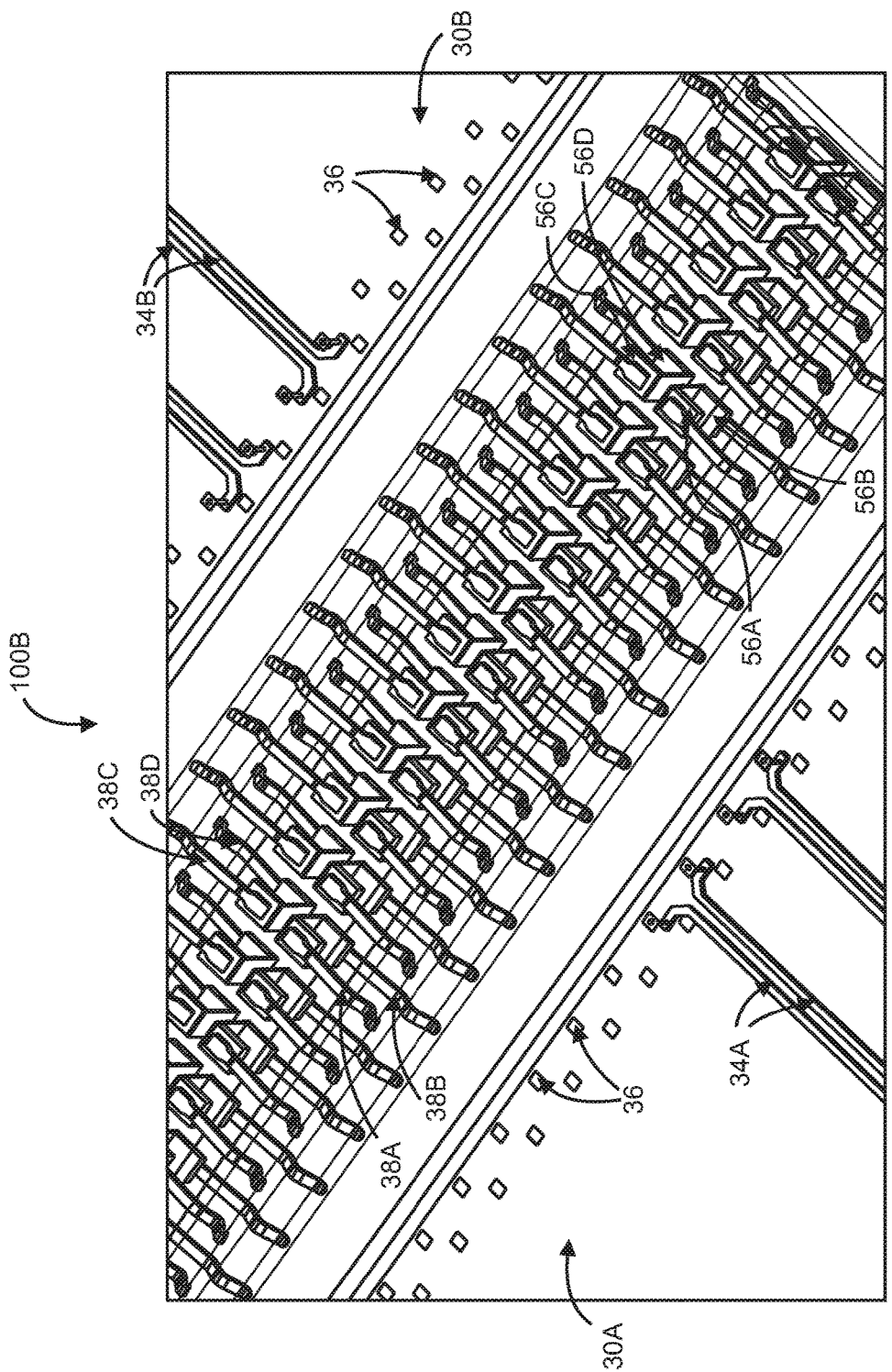
FIG. 11 is a perspective view of the board-edge interconnection module of FIG. 7, with the housing removed, according to some embodiments.

FIGS. 10 and 11 are perspective views of the board-edge interconnection module 100B, according to some embodiments. In FIGS. 9A-C, the housing 32 is mostly covering the components, with only the top horizontal plates 56A and 56C visible while, in FIG. 10, the housing is removed, thus revealing the vertical plates 40 that form the capacitors 50 and the horizontal plates 56 coupled to the contact pins 38. Pads 36 are also visible on the PCBs 30.

Figure 12B:
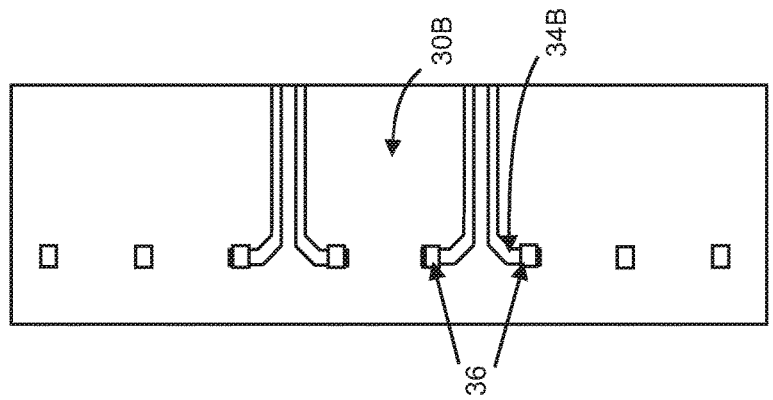
FIGS. 12A-C are overhead views of the board-edge interconnection module of FIG. 7, according to some embodiments.
Figure 12C:
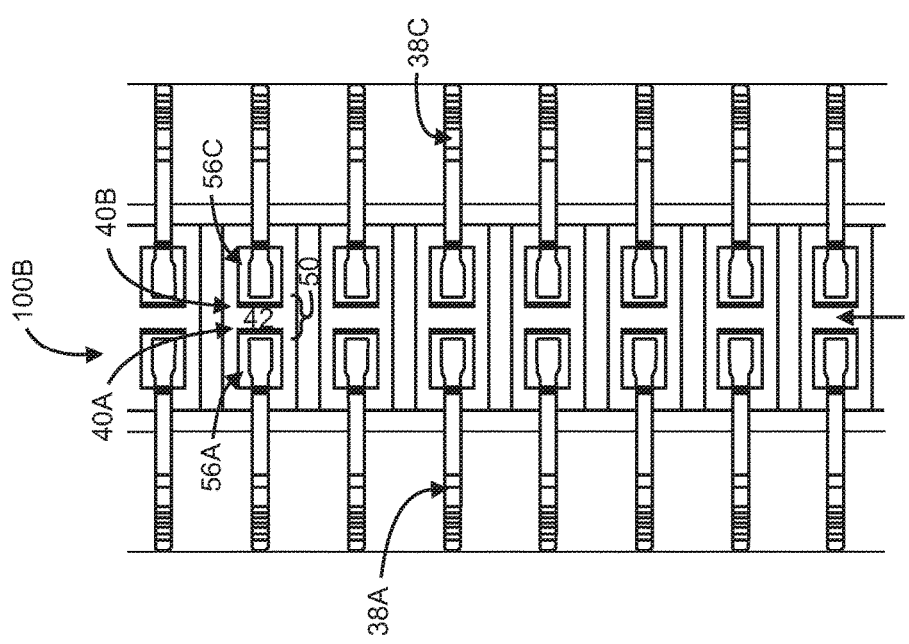
Figure 12A:
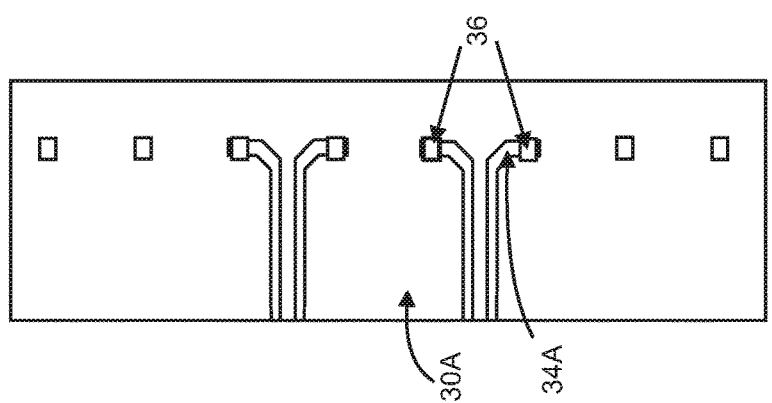

FIGS. 12A-C are overhead views of the board-edge interconnection module 100B, according to some embodiments. Only the upper contact pins 38A and 38C are visible, and they are coupled to respective upper horizontal plates 56A and 56C. Between the pairs of horizontal plates 56 are the capacitors 50, with the vertical plates 40A and 40B that form the capacitor appearing as thin, parallel lines with the dielectric 42 disposed in between the plates.

Figure 13:
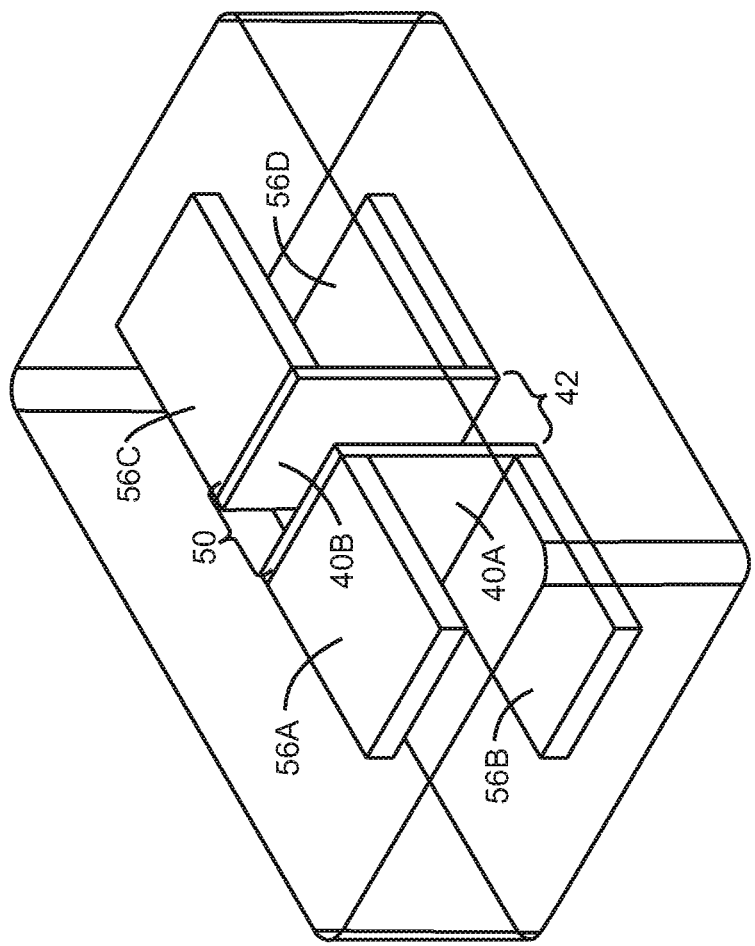
FIG. 13 is a depiction of the capacitor including vertical parallel plating and orthogonally disposed horizontal plating used in the board-edge interconnection modules of FIGS. 1 and 7, according to some embodiments.

FIG. 13 is a simplified three-dimensional electrical model of the inventive capacitor 50 used in the board-edge interconnection modules 100A and 100B. By now, the vertical plates 40A and 40B are familiar as the parallel plates that form the capacitor. Horizontal plates 56A-56D extend from the vertical plates 40, as described above. The horizontal plates 56 connect the capacitor 50 to other electrically conductive circuit elements, namely, the contact pins 38, as described above. Dielectric material 42 is disposed between the two vertical plates 40. Depending on the various dielectric constants ($\in_r$) being evaluated, the structure of the capacitor 50 depicted in FIG. 13, when included in an ultra-small form factor or dimension is able to harvest capacitance in the range of nano-Farads (nF), in some embodiments. When used in high-speed I/O interfaces, a capacitance in the nF range is capable of effectively eliminating the DC bias or blocking the low-frequency portions of a signal, in some embodiments.

Table 1 indicates the capacitance obtained using the capacitor 50 of FIG. 12C in the board-edge interconnection module 100A, used to couple the board to a docking station, or the board-edge interconnection module 100B, used to enable a board-to-board connection, according to some embodiments.

TABLE 1

Capacitance vs. permittivity, $\in_r$

| permittivity, $\in_r$ | capacitance (pF) |
|---|---|
| 4.91 | 57.475 |
| 100 | 1,138.4 |
| 1000 | 11,367 |

As reflected in Table 1, the capacitance is tabulated using different values of dielectric constant. Where the permittivity, $\in_r$, is about 1000, more than 10 nF of capacitance can be obtained.

FIGS. 14-23 are illustrations of a proposed board-edge interconnection module manufacturing process 200 for generating the board-edge interconnection module 100, according to some embodiments. Note that the process operations depicted in these drawings may take place in an order other than is shown herein Inner Layer Lamination (202)

Figure 14:
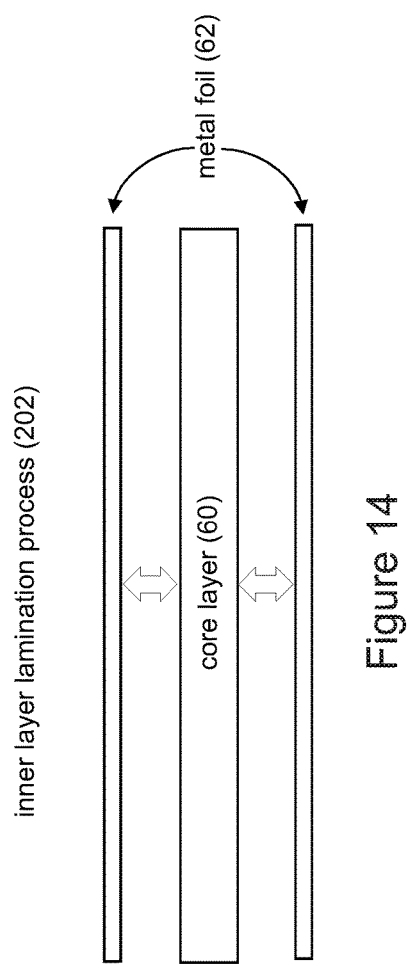

FIG. 14 illustrates an inner layer lamination process 202, also known as the copper cladding process, according to some embodiments. A core layer 60 has the characteristic of being somewhat stiff and rigid. The core layer 60 may be made up of any of a variety of materials, with a fiber-reinforced organic core being one example. Disposed above and below the core layer 60 is a metal layer or metal foil 62, which is typically copper, but may also include other metals.

During the inner layer lamination process 202 or copper cladding process, the metal foils 62 are pressed against the core layer 60 on respective upper and lower surfaces, to form a pressure and bonding to the core layer, thus forming a sandwiched substrate.

Laser or Mechanical Drilling Process (204)

Figure 15:
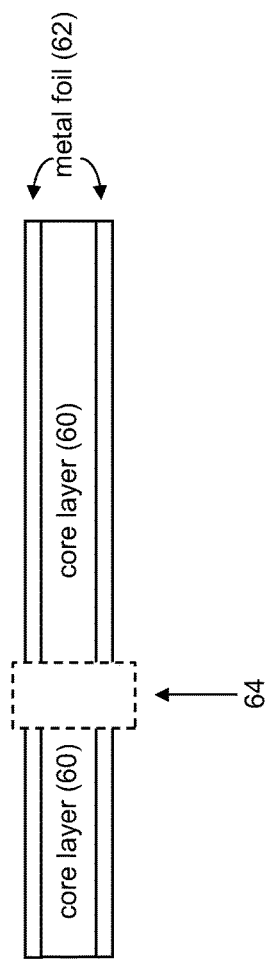
Figure 24:
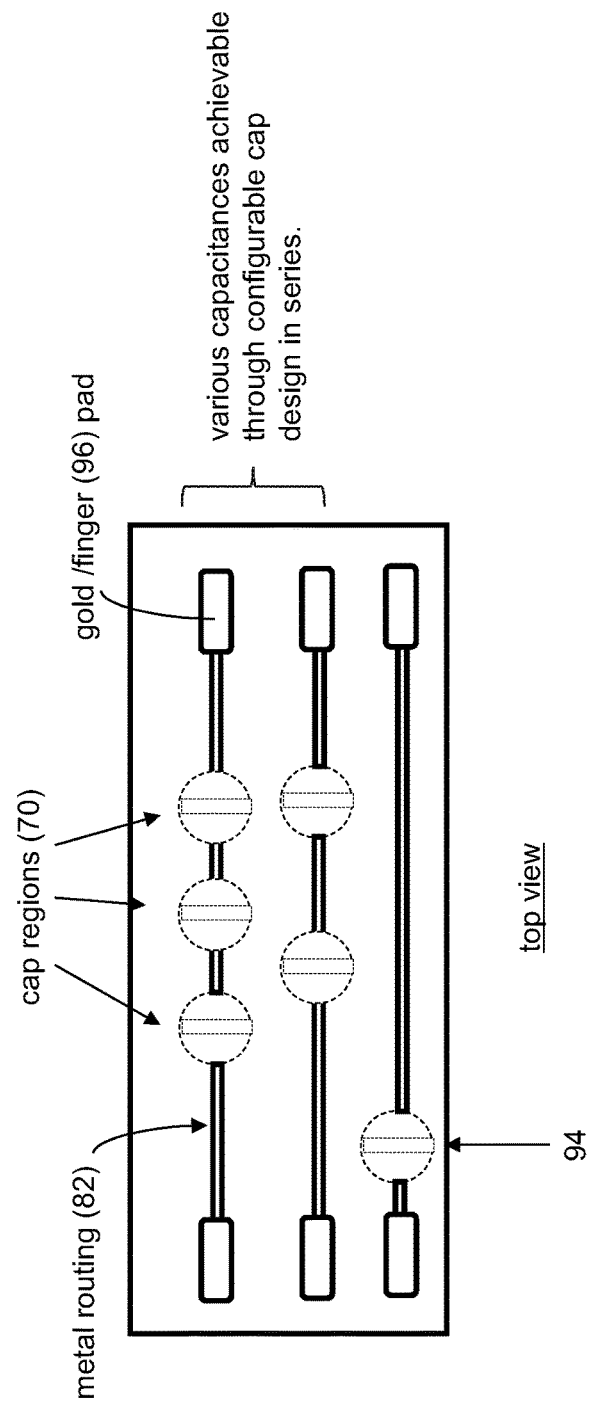
FIG. 24 is a diagram of an alternative manufacturing scheme for the board-edge interconnection modules of FIGS. 1 and 7, according to some embodiments.

FIG. 15 illustrates a mechanical or laser drilling process 204, also known as a PCB drilling process, according to some embodiments. A predefined location on the core layer 60, with the metal foils 62 now fixably attached thereto, is drilled so as to remove the sandwiched materials. The drilled region or void region 64 is the location where the capacitor 50 will be fabricated. Although not clear in FIG. 15, the drilling process forms a cylinder. A top view in FIG. 17B, given as first drilling result 64, in combination with the side view in FIG. 15, provides a more complete illustration. In other embodiments, the void region 64 may assume other shapes, such as a rectangular cube or other three-dimensional polygon. In still other embodiments, multiple void region 64 may be established along the transmission path in order to enable configurable capacitance values, as described in more detail below (FIG. 24).

Electroplating Process (206)

Figure 16:
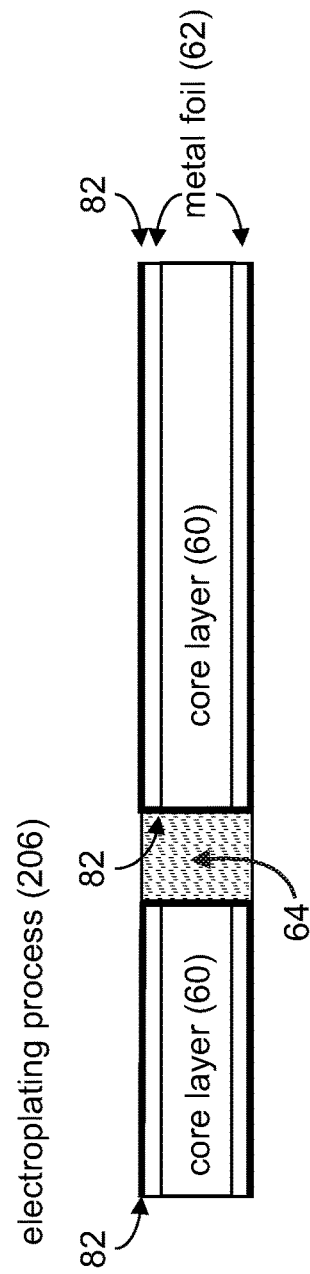

FIG. 16 illustrates an electroplating process 206, also known as an electroless and electrolytic plating process, according to some embodiments. This process 206 deposits a layer of metal 82 on the material. Electroless plating is used to form a thin metal layer on both non-conductive regions, such as the vertical wall of the void region 64, and on metal foil 62 surfaces. The plating material 82 is itself conductive, such as copper, nickel and silver. An electroless plating process can form a conductive layer several microns or less in thickness. Electrolytic plating is done on the conductive material only and is a thicker plating process.

In some embodiments, the layer 82 in FIG. 16 is formed in a two-step process: first, a thin layer of electroless plating is applied, then an electrolytic layer follows. The thickened lines as well as the cross-hatched area represent the regions having the electroplating material.

Second Laser or Mechanical Drilling Process (208)

Figure 17A:
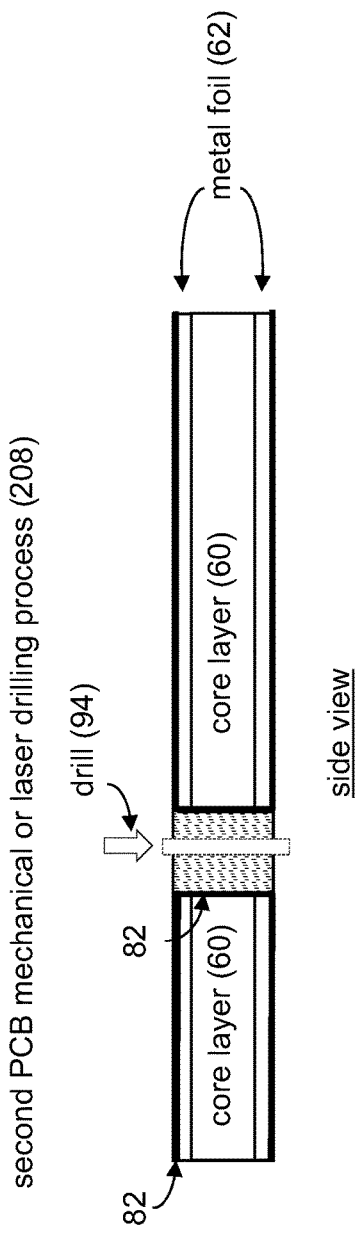
Figure 17B:
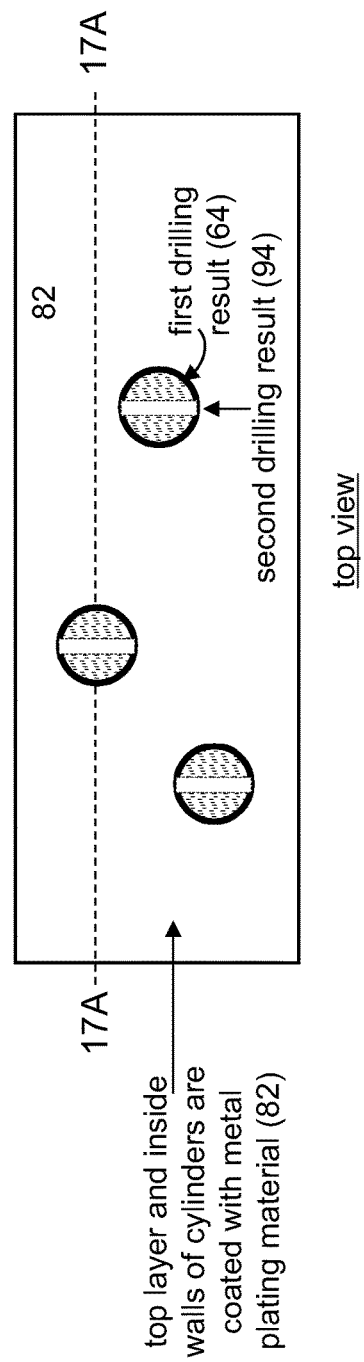

FIGS. 17A and B illustrate a second laser or mechanical drilling process 208, or PCB drilling process, according to some embodiments. In this process step, the electroplating material 82 that fills the void region 64 is being drilled through. FIG. 17A features a side view and FIG. 17B features a top view of the drilling process. The top view further shows that the entire surface consists of the electroplating material 82, and the first drilling result, the void region 64, is a circular region while the second drilling result 94 forms a rectangular cube. The rectangular cube void 94 is the region between the two plates of the capacitor 50 being formed. Thus, in a succeeding process step, the rectangular cube 94 will be filled with dielectric material 42. The size of the rectangular cube void 94 is determined by the process technology used, in some embodiments, and can be as small as a few microns in width.

High-k Dielectric Plugging Process (210)

Figure 18:
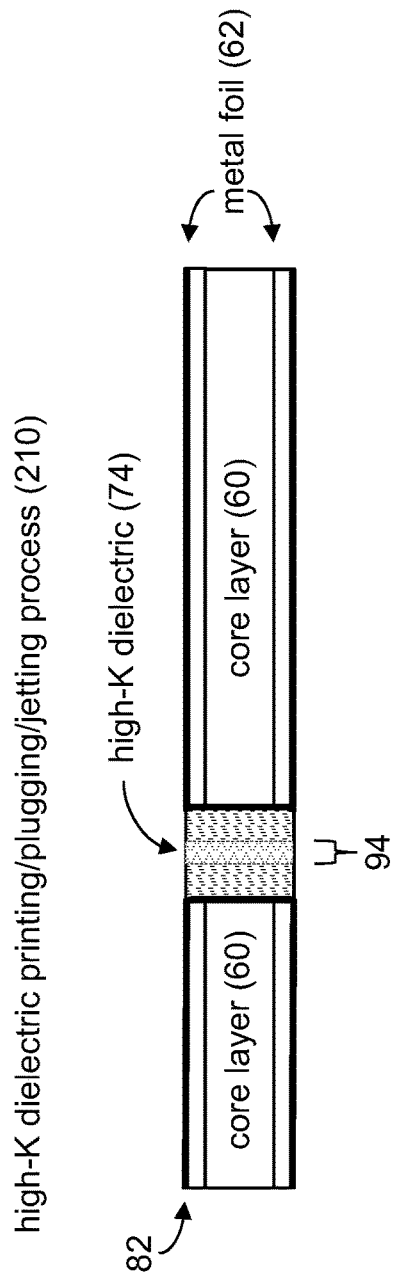

FIG. 18 illustrates a dielectric plugging process 210, in which a high-k dielectric material is injected into the rectangular cube void 94, according to some embodiments. The plugging process 210 is also known as a printing process or a jetting process. In any of these processes, the high-k material 74 (cross-hatched) is injected into the rectangular cube void 94. In other embodiments, a discrete capacitor may be embedded or attached to the sandwiched substrate (during the process operation in FIG. 15), thus avoiding the process operations shown in FIG. 16 to FIG. 18.

Photo-Resist Development Process (212)

FIGS. 19A and 19B illustrate a photo-resist development process 212, wherein a photo-resist layer is laminated and UV treated on the sandwiched substrate, according to some embodiments. Both a side view (FIG. 19A) and a top view (FIG. 19B) are provided. For ease of illustration, the side view features a cross-section, according to the 19A-19A line, with the capacitor 50 being at the far right of the side view, thus enabling the metal routing formation/etching process to be more clear. As the top view illustrates, the 19A-19A cross-section does not include the second void 94 containing the high-k dielectric material 74. Thus, those features are omitted from the side view.

The photo-resist development process 212 is a subtractive process in which a stencil mask 80 is disposed over a top surface of the sandwiched substrate, thus indicating what is to be removed. Recall from the top view of FIG. 18 that the entire surface of the material is covered in a metal material (the electroplating material 82), due to the electroplating process 206. In this process step, the surface is laminated with a photo-resist layer 78, then the stencil mask 80 is applied to the surface to indicate which areas are to remain, the exposed portion 76. The exposed portion 76 forms the metal routing.

Photo-Resist Stripping Process (214)

FIGS. 20A-B illustrate a photo-resist stripping process 214, also known as a chemical etching process, according to some embodiments. The photo-resist stripping process 214 is a subtractive process in which chemicals, ultra violet (UV) light, and other techniques are used to remove the unmasked areas from the process step 212. FIG. 20A features a side view while FIG. 20B features a top view, with the 20A-20A line also showing for clarity. Notice that the metal routing 82 in FIG. 20A corresponds to the exposed portion 76 in FIG. 19A.

Molding Process (216)

FIGS. 21A-B illustrate a molding process 216, also known as an injection over molding process, according to some embodiments. The molding process 216 involves coating everything with a material such as a polymer resin, so as to encapsulate and stiffen the entire substrate. The mold encapsulant 86 is shown as diagonal lines. In the top view, the entirety of the circuit would be covered in the polymer resin, but the coating is only shown on the bottom portion of the drawing, to reveal the underlying circuitry being coated. In some embodiments, the entire circuit will be encapsulated inside a metal chassis following the molding process.

Pad Exposure and Surface Finishing Process (218)

FIGS. 22A-B illustrate a pad exposure and surface finishing process 218, also known as a laser drilling and electroplating process, according to some embodiments. Because copper tends to oxidize easily if exposed to air, this process 218 adds a surface finish, such as gold, to the pads. A gold pad or finger 96 is shown in both the side view and the top view. The gold pad/finger 96 shown in FIGS. 22A-B is the horizontal plating metals 56 depicted in previous illustrations (see FIGS. 5 and 13, for example).

Contact Pin Attachment Process (220)

FIGS. 23A-B illustrate a contact pin attachment process 220, also known as a surface mounting and reflow process, according to some embodiments. Here, the contact pins 38 are soldered on to the pads 96 using a solder interconnection 90. For the board-edge interconnection module 100A, two contact pins 38 are used, one on the top and one on the bottom of the side view of the device. For the board-edge interconnection module 100B, four contact pins 38 are used, a left top, a left bottom, a right top, and a right bottom one.

Configurable AC Capacitor Process (250)

FIG. 24 presents a schematic illustration of a configurable AC capacitor process 250, used to generate AC capacitors 50 to be used in the board-edge interconnection modules 100A and 100B, according to some embodiments. Capacitance regions 70, or cap regions, are disposed next to one another, along the metal routing path 82 which was formed during the photo-resist stripping and etching process 214, as described above (see FIGS. 20A-B). The regions 70 are where the capacitors 50 are to be formed, such that the capacitors would be in series along the routing path 82.

In some embodiments, the capacitors produced in these three cap regions 70 may have different capacitances. The capacitances may vary according to size of the void region 94, which is controlled during the second PCB mechanical or laser drilling process 208 (FIGS. 17A-B), the type of dielectric material used, which happens during the high-K dielectric injection process 210 (FIG. 18), the total overlapping area between the vertical plating metals 40, which is determined during the first drilling process 204 (FIG. 15), and other factors. In the first drilling process 204 (FIG. 15), for example, three cylindrical holes of varying sizes could be drilled next to one another, thus setting up the process of creating three capacitors in series of varying sizes. Engineers of ordinary skill in the art will recognize these and other mechanisms by which the properties of the capacitor may be varied.

Figure 25:
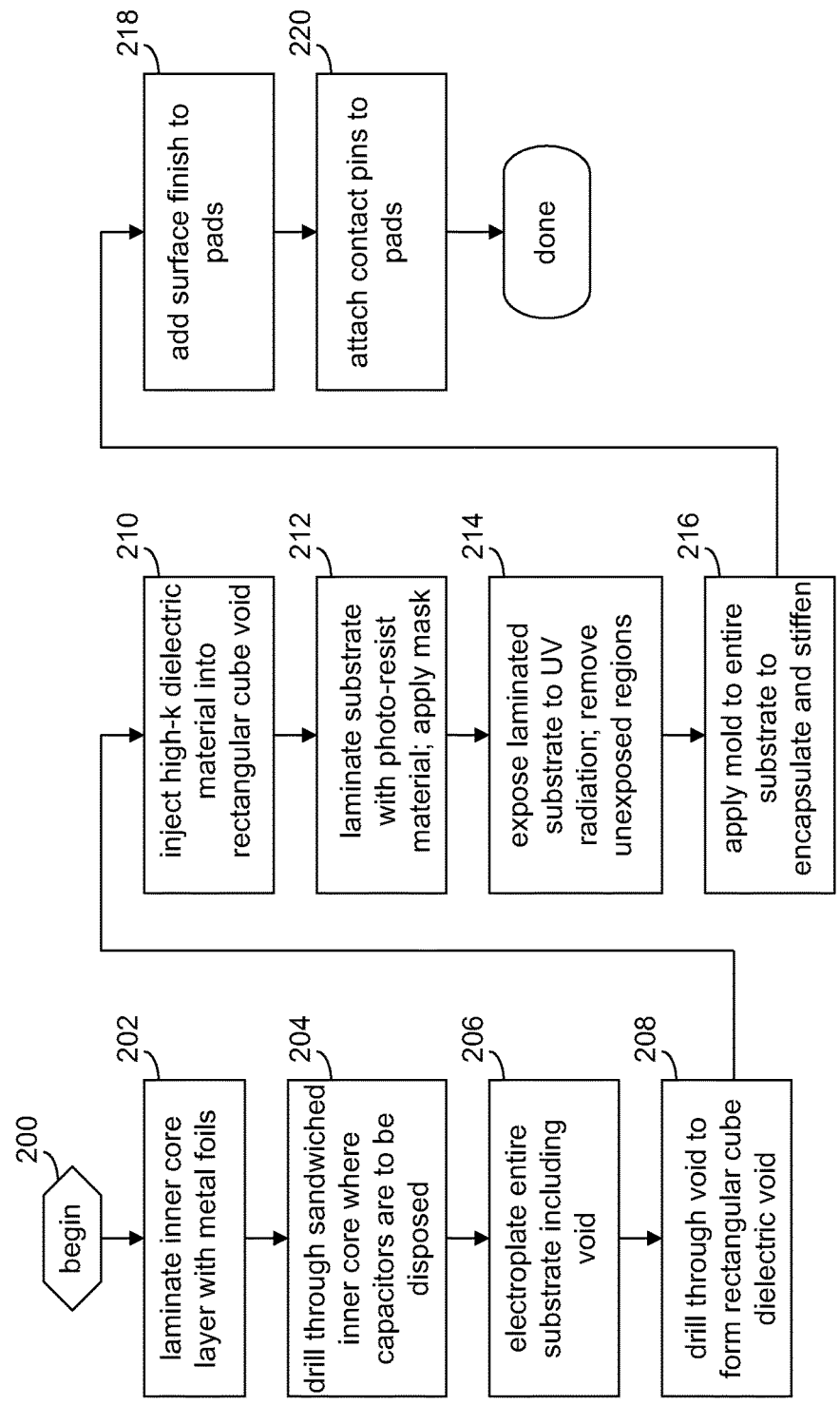
FIG. 25 is a flow diagram illustrating the process steps in manufacturing the board-edge interconnection modules of FIGS. 1 and 7, according to some embodiments.

FIG. 25 is a simplified flow diagram including the above-described process steps 200 in manufacturing the board-edge interconnection module 100, according to some embodiments. Although the process steps are illustrated in a particular sequence, with each step succeeding the previous step in time, board designers of ordinary skill in the art recognize that one or more of these process steps may be performed in a different order, or two process steps may take place simultaneously. The process steps of FIG. 25 are best understood when absorbed in conjunction with the illustrations of FIGS. 14-23.

Any original device manufacturer (ODM) or original equipment manufacturer (OEM) who may build a PC-on-a-card kind of miniaturized system, or anyone who builds or uses differential high-speed I/O interfaces into their platforms such as USB 3.1, are likely to benefit using the board-edge interconnection module 100. Cable and connector vendors likewise may desire to manufacture and sell their products with such a design.

The board-edge interconnection module 100 enables a manufacture to come up with a one-of-a-kind PC-on-a-card system, so as to revolutionize the wearables and/or IoT industry, in some embodiments.

While the application has been described with respect to a limited number of embodiments, those skilled in the art will appreciate numerous modifications and variations therefrom. It is intended that the appended claims cover all such modifications and variations as fall within the true spirit and scope of the invention.

We claim:

1. A board-edge interconnection module comprising:
   a housing coupled to an edge of a printed circuit board (PCB);
   a first pair of contact pins disposed along one side of the housing, the contact pins to fixably secure the housing to the PCB, the first pair of contact pins further comprising:
      a first contact pin disposed at a top portion of the housing, the first contact pin to form an electrical connection between a trace on a top layer of the PCB and a first member of one of the second parallel plates; and
      a second contact pin disposed at a bottom portion of the housing, the second contact pin being aligned with the first contact pin such that the two pins fixably secure the housing to the PCB;
   a capacitor comprising:
      a first pair of parallel plates comprising metal material, wherein the parallel plates are electrical conductors disposed a predetermined distance apart; and
      a dielectric material disposed between the first pair of parallel plates; and
      a second pair of parallel plates coupled orthogonally to the first pair of parallel plates, wherein the second pair of parallel plates couple the capacitor to the first pair of contact pins;
   wherein, once the housing is coupled to an external device, the capacitor isolates any direct current (DC) bias between one or more circuits located on the PCB and circuits located on the device.

2. The board-edge interconnection module of claim 1, wherein the capacitor is an alternating current capacitor.

3. The board-edge interconnection module of claim 1, wherein the second contact pin forms an electrical connection between a second trace on a bottom layer of the PCB and a second member of one of the second parallel plates.

4. The board-edge interconnection module of claim 1, wherein the second contact pin does not form an electrical connection to the PCB.

5. The board-edge interconnection module of claim 1, further comprising:
   a second pair of contact pins disposed along a second side of the housing, the contact pins to fixably secure the housing to the second PCB;
   a second pair of orthogonal parallel plates coupled orthogonally to the first pair of parallel plates, wherein the second pair of orthogonal parallel plates couple the capacitor to the second pair contact pins.

6. The board-edge interconnection module of claim 5, the first pair of contact pins further comprising:
   a first contact pin disposed at a top portion of the housing, the first contact pin to form an electrical connection between a trace on a top layer of the PCB and a first member of one of the second parallel plates; and
   a second contact pin disposed at a bottom portion of the housing, the second contact pin being aligned with the first contact pin such that the two pins fixably secure the housing to the PCB;
the second pair of contact pins further comprising:
   a third contact pin disposed at a top portion of the housing, the third contact pin to form an electrical connection between a second trace on a top layer of the second PCB and a second member of one of the second parallel plates; and
   a fourth contact pin disposed at a bottom portion of the housing, the fourth contact pin being aligned with the third contact pin such that the two pins fixably secure the housing to the second PCB.

7. The board-edge interconnection module of claim 1, further comprising:
   a second pair of parallel plates disposed in parallel to the first pair of parallel plates, the first pair of parallel plates further comprising:
   a first plate comprising a positive terminal; and
   a second plate comprising a negative terminal; and
the second pair of parallel plates further comprising:
   a third plate comprising a positive terminal; and
   a fourth plate comprising a negative terminal;
   the first plate being disposed adjacent to the second plate and the third plate being disposed adjacent to the fourth plate, with the dielectric material being disposed between the first plate and the second plate, the second plate and the third plate, and the third plate and the fourth plate;
wherein the first plate, the second plate, the third plate, and the fourth plate are in parallel to one another.

8. The board-edge interconnection module of claim 1, wherein the dielectric material is a high-k dielectric material.

* * * * *